United States Patent
Yoshida et al.

(10) Patent No.: US 7,547,053 B2
(45) Date of Patent: Jun. 16, 2009

(54) SUBSTRATE GRIPPING APPARATUS, SUBSTRATE GRIPPING METHOD AND SUBSTRATE RELEASING METHOD

(75) Inventors: Tetsuya Yoshida, Kakogawa (JP); Akira Ukita, Nishinomiya (JP)

(73) Assignee: Kawasaki Jukogyo Kabushiki Kaisha, Kobe (JP)

( * ) Notice: Subject to any disclaimer, the term of this patent is extended or adjusted under 35 U.S.C. 154(b) by 481 days.

(21) Appl. No.: 11/090,236

(22) Filed: Mar. 28, 2005

(65) Prior Publication Data
US 2005/0210669 A1 Sep. 29, 2005

(30) Foreign Application Priority Data
Mar. 29, 2004 (JP) ............. 2004-096354

(51) Int. Cl.
*B65G 49/07* (2006.01)
(52) U.S. Cl. .................. 294/103.1; 414/941
(58) Field of Classification Search ........... 294/103.1; 414/941
See application file for complete search history.

(56) References Cited

U.S. PATENT DOCUMENTS

| 4,900,214 | A | * | 2/1990 | Ben ................... 294/103.1 |
| 5,133,635 | A | * | 7/1992 | Malin et al. ........... 294/104 |
| 6,256,555 | B1 | * | 7/2001 | Bacchi et al. ............ 294/88 |
| 6,361,422 | B1 | * | 3/2002 | Ettinger et al. .......... 451/339 |
| 6,454,332 | B1 | * | 9/2002 | Govzman et al. ........ 294/64.1 |
| 6,678,581 | B2 | * | 1/2004 | Hung et al. ............. 700/245 |

FOREIGN PATENT DOCUMENTS

| JP | 62-043144 A | 2/1987 |
| JP | 10-181877 A | 7/1998 |
| JP | 2000-208599 A | 7/2000 |
| JP | 2002-134586 A | 5/2002 |
| JP | A 2002-141405 | 5/2002 |
| JP | 2003-142393 A | 5/2003 |
| JP | 2003-338531 A | 11/2003 |
| JP | 2005-197482 A | 7/2005 |

* cited by examiner

*Primary Examiner*—Paul T Chin
(74) *Attorney, Agent, or Firm*—Oliff & Berridge, PLC

(57) ABSTRACT

A robot hand 23 having a hand body 30 having a reference axis J1 is provided with fixed holding members 40 and 41 and a movable holding member 42. The holding members 40, 41 and 42 are arranged on the hand body at angular intervals about the reference axis J1. Each of the fixed holding members 40 and 41 has a first guide part 50 and a second guide part 51 defining a V-shaped groove. The movable holding member 42 has a first guide part 60 and a second guide part 61 defining a V-shaped groove. Peripheral parts 19 of a wafer 22 are fit in the V-shaped grooves of the holding members 40 to 42 to grip the wafer 22 by the robot hand 23. The first guide parts 50 and 61 are provided at their lower ends with protrusions 55 and 65 protruding toward the reference axis J1, respectively. The protrusions 55 and 65 prevent the wafer 22 from slipping off the holding members 40 to 42.

12 Claims, 19 Drawing Sheets

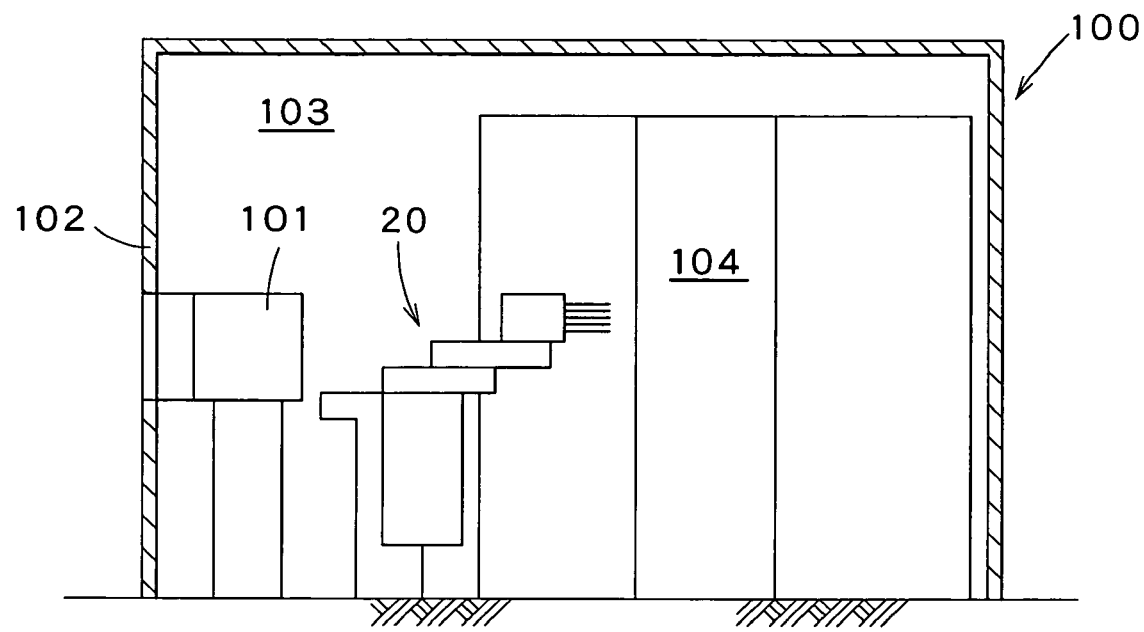
F I G . 2 1
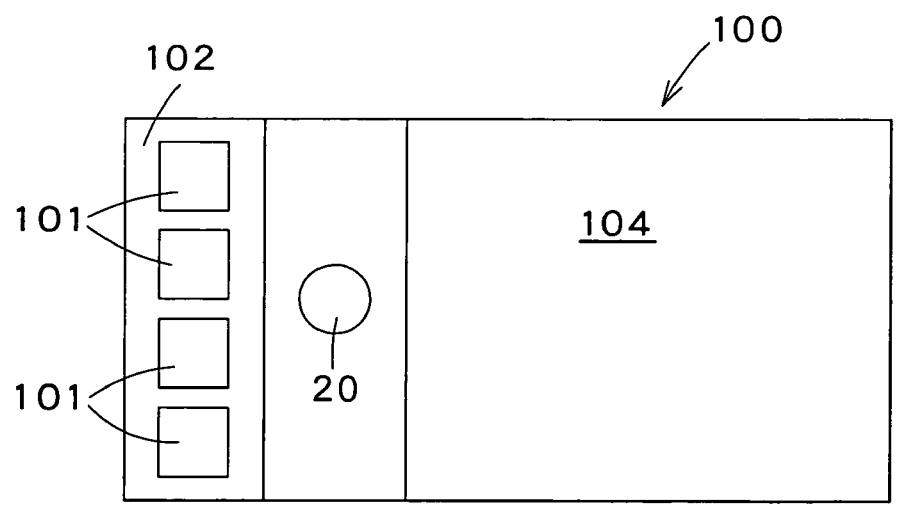
F I G . 2 2

SUBSTRATE GRIPPING APPARATUS, SUBSTRATE GRIPPING METHOD AND SUBSTRATE RELEASING METHOD

TECHNICAL FIELD

The present invention relates to a substrate gripping apparatus for gripping a substrate, and more specifically, a semiconductor wafer, a substrate gripping method and a substrate releasing method.

BACKGROUND ART

A substrate gripping apparatus for gripping a disk-shaped semiconductor wafer is disclosed in Patent document 1. This substrate gripping apparatus approaches a wafer supported on a substrate support member from below the wafer to bring a support surface into contact with the wafer, and raises the support surface to lift up the wafer.

The substrate support member supports the wafer thereon. Therefore, when the substrate gripping apparatus approaches the substrate support member from below the wafer, the substrate gripping apparatus must be moved so as not to interfere with the substrate support member. In most cases, the substrate support member and the substrate gripping apparatus are used in a narrow space, such as a clean room. In such a case, shapes and construction of the substrate support member and the substrate gripping apparatus are subject to restrictions and the restrictions may possibly exert adverse influences on processing wafers.

Patent document 1: JP 2002-141405 A

DISCLOSURE OF THE INVENTION

If it is possible to approach a substrate, such as a wafer, to grip the substrate in a space on one side of the substrate supported on the substrate support member opposite a space on the other side of the substrate in which the substrate support member is disposed, interference between the substrate gripping apparatus and the substrate support member in a limited space can be avoided and adverse influences on processing substrates can be improved.

An object of the present invention is to provide a substrate gripping apparatus capable of approaching a substrate supported on a substrate support member in a space on one side of the substrate supported on the substrate support member opposite a space on the other side of the substrate in which the substrate support member is disposed and of gripping the substrate supported on the substrate support member.

A substrate gripping deice according to the present invention for gripping a substrate supported on a substrate support member includes: a hand body having a predetermined reference axis and formed in the shape of a flat plate perpendicular to the reference axis; a hand body driving means for driving the hand body for displacement; a plurality of holding members including at least one movable one, arranged on the hand body around the reference axis at angular intervals and capable of coming into contact with the circumference of the substrate to hold the substrate and of being separated from the circumference of the substrate to release the substrate; a movable holding member driving means for driving the movable holding member for an approaching movement toward the reference axis and a parting movement away from the reference axis; and a control means for controlling the hand body driving means and the movable holding member driving means; wherein each of the holding members has a first guide part extending near a peripheral part of the substrate toward the substrate support member in a state where the hand body is disposed on one side of the substrate supported on the substrate support member opposite the other side of the substrate on which the substrate support member is disposed, and a second guide member extending from the first guide part toward the reference axis, the first and the second guide parts define a substantially V-shaped groove for receiving the peripheral part of the substrate, and the first guide part is provided at a position apart from the second guide part with a protrusion protruding toward the reference axis.

According to the present invention, the hand body is moved toward the substrate in a space on one side of the substrate supported on the substrate support member opposite a space on the other side of the substrate in which the substrate support member is disposed, with the holding members displaced in a parting direction to dispose the holding members opposite to the circumference of the substrate. Subsequently, the movable holding member is moved in the approaching direction to place peripheral parts of the substrate in the V-shaped grooves of the holding members so that the substrate may be held by its peripheral parts by the cooperative holding actions of the holding members. The substrate is restrained from being displaced by holding the peripheral parts thereof in the V-shaped grooves. When the hand body holding the substrate is moved away from the substrate support member, the substrate can be separated from the substrate support member together with the hand body and can be gripped by the hand body. Thus the substrate can be gripped by the holding members with the hand body spaced apart from the substrate support member and disposed in the space on one side of the substrate supported on the substrate support member opposite the space on the other side of the substrate in which the substrate support member is disposed.

Since the holding members engage with the peripheral parts of the substrate to grip the substrate, the holding members exert pressure on the substrate when the substrate is gripped. The pressure exerted on the substrate by the holding members must be set so that the thus gripped substrate is not broken. If the first guide parts are not provided with the protrusions, the resistance of the substrate against separation from the substrate support member cannot be cancelled and the substrate slides on the first guide parts of the holding members toward the substrate support members and the substrate cannot be separated from the substrate support member.

In the substrate gripping apparatus according to the present invention, the circumference of the substrate slid along the first guide parts comes into contact with the protrusions. Thus the substrate is restrained from slipping off the first guide parts, and the substrate can be surely gripped against a large resistance even if the pressure exerted on the substrate by the holding members is low. For example, the resistance against the separation of the substrate from the substrate support member is generated by the atmospheric pressure.

Since the substrate can be restrained from slipping off the holding members by the protrusions, first guide surfaces formed in the first guide parts to guide the substrate do not need to be extended at a small angle to the circumferential side wall of the substrate, and the angle between the first guide surfaces and the circumferential side surface of the substrate may be nearly equal to 90°. Therefore, the radial dimension of the first guide surfaces with respect to the reference axis may be small and hence the first guide surfaces can be easily brought into engagement with a surface, on the side of the substrate support member, of the substrate.

In the substrate gripping apparatus according to the present invention, the holding members are radially spaced by a distance corresponding to the radius of the substrate apart from the reference axis and are arranged at angular intervals so as to hold the disk-shaped substrate with the axis of the substrate aligned with the reference axis.

According to the present invention, the substrate can be gripped in a position perpendicular to the reference axis with its axis aligned with the reference axis. Even if the substrate is supported on the substrate support member at a correct position, the substrate can be gripped and positioned and can be carried to another substrate support member.

In the substrate gripping apparatus according to the present invention, the first guide part of at least one of the holding members has a first guide surface extending obliquely so as to be gradually apart from the substrate supported on the substrate support member while approaching to the reference axis, and the second guide part of the holding member has a positioning surface continuous with the first guide surface and perpendicular to the reference axis and an inclined surface continuous with the positioning surface and extending obliquely so as to be gradually apart from the substrate while approaching to the reference axis.

In the substrate gripping apparatus according to the present invention, the first guide part of each of the holding members has a first guide surface extending obliquely so as to be gradually apart from the substrate supported on the substrate support member while approaching to the reference axis, and the second guide part of the same holding member has a positioning surface continuous with the first guide surface and perpendicular to the reference axis, and an inclined surface continuous with the position surface and extending obliquely so as to be gradually apart from the substrate while approaching to the reference axis.

According to the present invention, in a state where the substrate is held by the holding members, the peripheral parts of the substrate are in contact with the positioning surfaces. Since the positioning surfaces are contained in a plane perpendicular to the reference axis, the substrate in contact with the positioning surfaces is kept perpendicular to the reference axis. Preferably, the positioning surfaces are formed in the plurality of holding members, respectively. Formation of the positioning surfaces in the plurality of holding members is effective for the further accurate positioning of the substrate.

In the substrate gripping apparatus according to the present invention, the movable holding member driving means applies a resilient force to the movable holding member with a spring to push the movable holding member toward the reference axis.

According to the present invention, when the hand body is moved in a state where the substrate supported on the substrate support member is gripped, a resistance acts on the substrate. When the resistance acts on the substrate, the substrate exerts a pressure on the movable holding member in a parting direction. The movable holding member is moved in the parting direction if the pressure is higher than the resilient force. The resilient force is adjusted to exert a moderate pressure that may neither deform nor damage the substrate. Therefore, in some cases, a force for separating the substrate is unable to exceed the resistance acting on the substrate. Even if the movable holding member is displaced slightly in the parting direction, the substrate is restrained from slipping off the holding members because, as mentioned above, the present invention uses the protrusions to restrain the substrate from slipping off the substrate support member.

When a resilient force generating means capable of automatically generating a resilient force, such as a spring, is used in combination with a driving means to operate the movable holding ember, the substrate can be kept gripped even if the driving means fails to function properly due to some trouble.

The substrate gripping apparatus according to the present invention further includes a detecting means for detecting the movable holding member located at a gripping position to grip the substrate together with the rest of the holding members; and an informing means for providing information about the result of a detecting operation performed by the detecting means.

According to the present invention, the informing means informs the operator of the result of a detecting operation performed by the detecting means and hence the operator is able to know whether or not the substrate has been gripped by the holding members.

In the substrate gripping apparatus according to the present invention, the second guide parts of the movable holding member is fixed to the hand body, and the first guide part of the movable holding member is driven for displacement by the movable holding member driving means.

According to the present invention, the substrate can be guided by fixing the second guide part to the hand body regardless of the position of the first guide part. Thus the direct contact of the substrate with the hand body can be surely prevented.

In the substrate gripping apparatus according to the present invention, the protrusion is formed at the farthest position from the second guide part on the first guide part, and the protrusion comprises a first protruding surface continuous with the first guide surface and sloping down toward the reference axis.

In the substrate gripping apparatus according to the present invention, the protrusion further comprises a second protruding surface continuous with the first protruding surface and sloping down away from the reference axis.

A substrate gripping deice according to the present invention for gripping a substrate supported on a substrate support member includes: a plurality of hand bodies, each having a predetermined reference axis and formed in the shape of a flat plate perpendicular to the reference axis; hand body driving means for driving the hand bodies for displacement; a plurality of holding members including at least one movable one, arranged on each of the hand bodies around the reference axis at angular intervals and capable of coming into contact with peripheral parts of the substrate to hold the substrate and of being separated from the peripheral parts of the substrate to release the substrate; a movable holding member driving means for driving the movable holding member of each of the hand bodies for an approaching movement toward the reference axis and a parting movement away from the reference axis; and a control means for controlling the hand body driving means and the movable holding member driving means; wherein each of the holding members has a first guide part extending near the peripheral part of the substrate toward the substrate support member in a state where the hand body is disposed on one side of the substrate supported on the substrate support member opposite the other side of the substrate on which the substrate support member is disposed, and a second guide member extending from the first guide part toward the reference axis, the first and the second guide parts define a substantially V-shaped groove for receiving the peripheral part of the substrate, and the first guide part is provided at a position apart from the second guide part with a protrusion protruding toward the reference axis.

The substrate gripping apparatus according to the present invention is capable of gripping a plurality of substrates simultaneously. The substrate gripping apparatus provided with the plurality of hand bodies is inevitably large. Since the substrate can be gripped in a state where the hand body is disposed in a space on one side of the substrate opposite a space on the other side of the substrate in which the substrate support member is disposed, interference between the substrate support member and the substrate gripping apparatus can be avoided even if the substrate gripping apparatus is large.

A substrate gripping method using a substrate gripping deice, for gripping a substrate supported on a substrate support member, including a hand body having a predetermined reference axis and formed in the shape of a flat plate perpendicular to the reference axis, a hand body driving means for driving the hand body for displacement, a plurality of holding members including at least one movable one, arranged on the hand body around the reference axis at angular intervals and capable of coming into contact with peripheral parts of the substrate to hold the substrate and of being separated from the peripheral parts of the substrate to release the substrate, a movable holding member driving means for driving the movable holding member for an approaching movement toward the reference axis and a parting movement away from the reference axis, and a control means for controlling the hand body driving means and the movable holding member driving means comprises the steps of: moving the hand body toward a substrate from one side of the substrate opposite the other side of the substrate on which the substrate support member is disposed; bringing a fixed holding members into contact with the peripheral part of the substrate; moving the movable holding member toward the reference axis by the movable holding member driving means to bring the movable holding member into contact with the peripheral part of the substrate; and moving the hand body away from the substrate support member.

The substrate gripping method according to the present invention brings the movable holding member into contact with the peripheral part of the substrate after bringing the fixed holding members into contact with the peripheral parts of the substrate, and then moves the hand body away from the substrate support member. Thus the substrate is prevented from sliding on the substrate support member to reduce the possibility of damaging the substrate and adhesion of particles to the substrate, and the quality deterioration of the substrate can be prevented.

A substrate releasing method using a substrate gripping deice, for gripping a substrate supported on a substrate support member, including a hand body having a predetermined reference axis and formed in the shape of a flat plate perpendicular to the reference axis, a hand body driving means for driving the hand body for displacement, a plurality of holding members including at least one movable one, arranged on the hand body around the reference axis at angular intervals and capable of coming into contact with peripheral parts of the substrate to hold the substrate and of being separated from the peripheral parts of the substrate to release the substrate, a movable holding member driving means for driving the movable holding member for an approaching movement toward the reference axis and a parting movement away from the reference axis, and a control means for controlling the hand body driving means and the movable holding member driving means comprises the steps of: moving the hand body gripping a substrate toward the substrate support member and placing the substrate on the substrate support member; moving the movable holding member away from the reference axis by the movable holding member driving means to separate the movable holding member from the peripheral part of the substrate; and moving the hand body away from the substrate support member.

The substrate releasing method according to the present invention separates the holding members from peripheral parts of the substrate after placing the substrate on the substrate support member. Thus the substrate is prevented from sliding on the substrate support member to reduce the possibility of damaging the substrate and adhesion of particles to the substrate, and the quality deterioration of the substrate can be prevented.

According to the present invention, the substrate can be gripped by the hand body disposed in a space on one side of the substrate supported on the substrate support member opposite a space on the other side of the substrate in which the substrate support member is disposed. Thus the possibility of a gripping operation for gripping the substrate being obstructed by the substrate support member can be reduced. Consequently, restrictions on the shapes and construction of the substrate support member and the substrate gripping apparatus can be reduced and problems in processing substrates can be reduced. The substrate is often carried in a narrow space, such as a clean room. Since the possibility of interference between the substrate support member and the substrate gripping apparatus can be reduced, the operator is able to teach positions to the substrate gripping apparatus easily.

For example, the substrate gripping apparatus can operate in a large space for gripping and placing the substrate on the substrate support member and, at the same time, the substrate gripping apparatus can be formed in small longitudinal and lateral dimensions. Therefore, a plurality of hand bodies can be stacked up. Even if a substrate, such as a wet substrate or a substrate held on the substrate support member by suction, exerts high resistance on the substrate gripping apparatus when the substrate is separated from the substrate support member, the substrate can be surely separated from the substrate support member.

According to the present invention, the substrate can be positioned with its axis aligned with the reference axis and the side surface along its thickness extended parallel to the reference axis. Therefore, the substrate does not need to be correctly located on the substrate support member and hence the substrate support member can be formed in simple construction.

According to the present invention, the substrate can be held by the holding members perpendicularly to the reference axis. Therefore, the dislocation of the substrate during the movement of the hand body holding the substrate can be prevented. The gripped substrate correctly positioned can be accurately carried.

According to the present invention, gripping force to be applied to the substrate to grip the substrate is adjusted so that the substrate may not be damaged. It is possible that a resistance against the separation of the substrate from the substrate support member causes the substrate to fall off the substrate gripping apparatus when the gripping device separates the substrate from the substrate support member. The present invention is able to minimize a component of the resistance acting in a gripping direction. Thus a quick substrate separating operation is possible, a substrate gripping operation can be completed in a short time, and working efficiency can be improved. The substrate can be gripped in a position perpendicular to the reference axis by bringing the positioning surfaces into contact with the circumference of the substrate.

According to the present invention, it is possible to inform the operator of a state where the substrate is not gripped on the basis of the results of a detecting operation of the detecting means. Since the substrate gripping operation according to the present invention is performed with the hand body disposed in a space on one side of the substrate supported on the substrate support member opposite a space on the other side of the substrate in which the substrate support member is disposed, in some cases, the operator is unable to determine visually whether or not the substrate is held by the holding members. The present invention informs the operator of whether or not the substrate is gripped on the basis of the results of a detecting operation of the detecting means to improve convenience.

According to the present invention, the second guide part is fixed to the hand body and hence the substrate can be guided regardless of the position of the first guide part and the substrate can be prevented from direct contact with the hand body. A capture range in which the substrate gripping apparatus is able to grip the substrate can be expanded.

According to the present invention, the hand body can be formed in a small thickness and hence the interference between the substrate support member and the substrate gripping apparatus can be avoided. Consequently, a plurality of substrate can be simultaneously gripped. Thus the efficiency of a substrate processing operation can be improved.

According to the present invention, since the substrate can be prevented from being rubbed with the substrate support member when the substrate is released, the possibility of damaging the substrate and adhesion of particles to the substrate can be prevented, and the quality of the substrate can be improved.

BRIEF DESCRIPTION OF THE DRAWINGS

FIG. 21 is a schematic sectional view of a substrate processing system;

FIG. 22 is a schematic plan view of the substrate processing system;

BEST MODE FOR CARRYING OUT THE INVENTION

Figure 1:
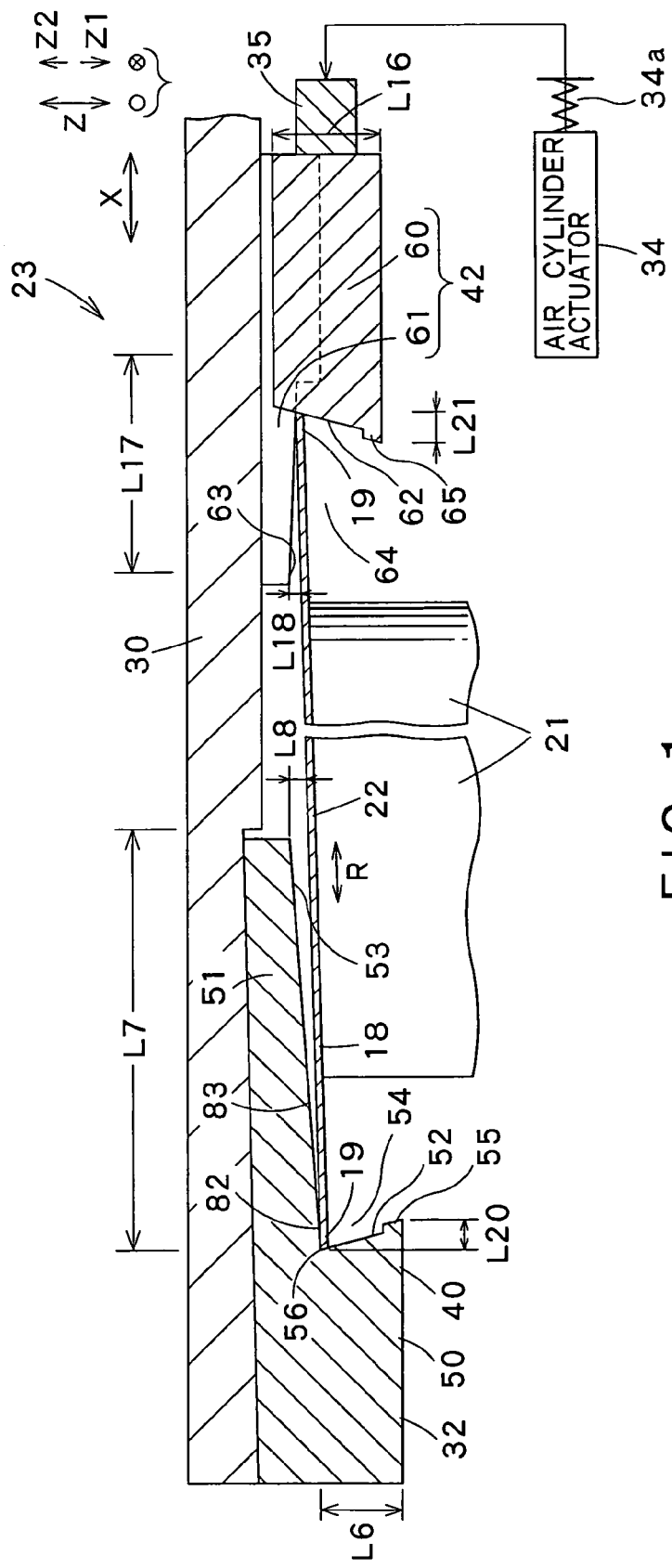
FIG. 1 is a sectional view of a part of a substrate gripping apparatus in a preferred embodiment according to the present invention.
Figure 2:
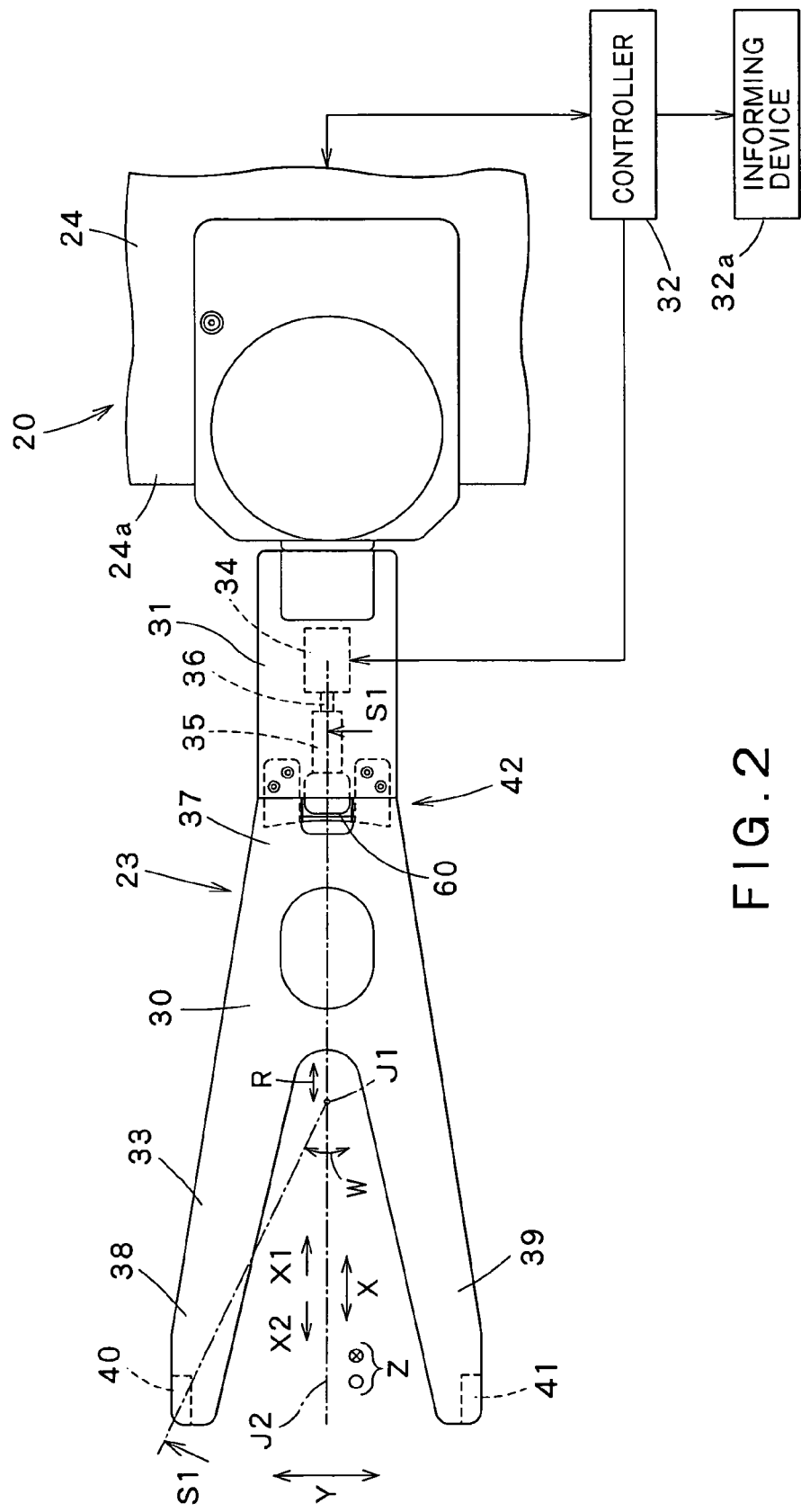
FIG. 2 is a plan view of the substrate gripping apparatus.
Figure 3:
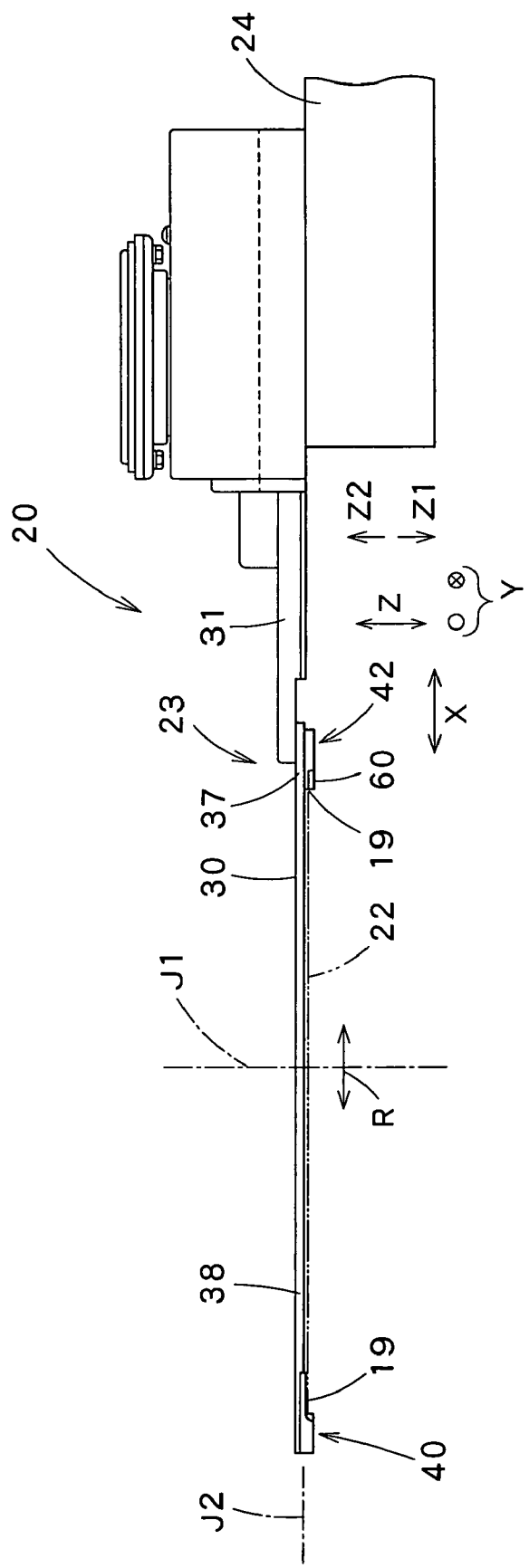
FIG. 3 is a front elevation of the substrate gripping apparatus.
Figure 4:
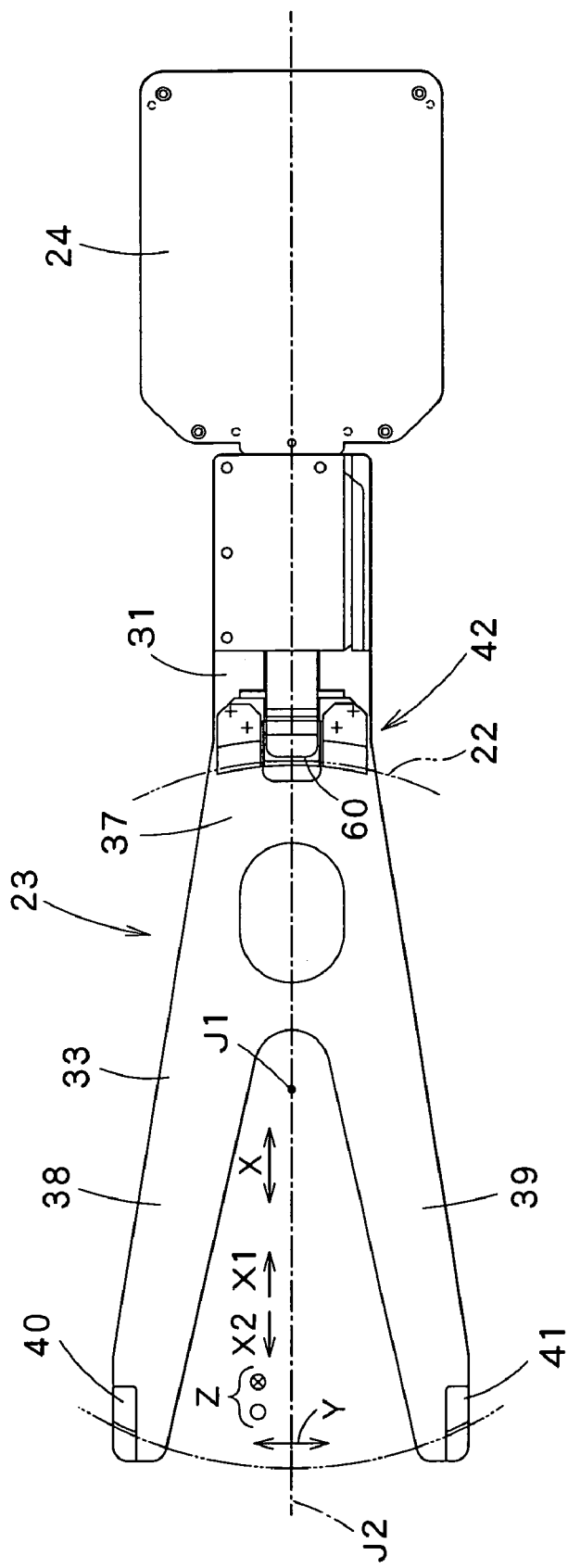
FIG. 4 is a bottom view of the substrate gripping apparatus.
Figure 5:
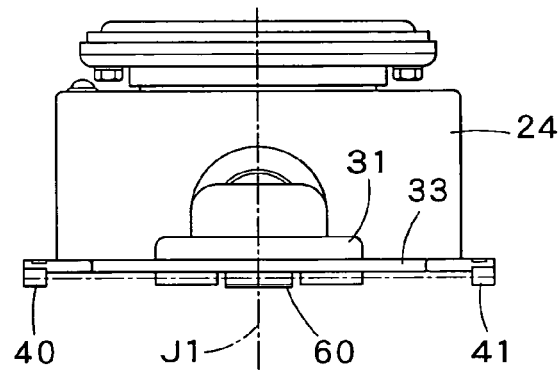
FIG. 5 is a side elevation of the substrate gripping apparatus.

FIG. 1 is a sectional view of a part of a substrate gripping apparatus 20 in a preferred embodiment according to the present invention. FIG. 2 is a plan view of the substrate gripping apparatus 20. FIG. 3 is a front elevation of the substrate gripping apparatus 20. FIG. 4 is a bottom view of the substrate gripping apparatus 20. FIG. 5 is a side elevation of the substrate gripping apparatus 20. FIG. 1 is a sectional view taken on the line S1-S1 in FIG. 2.

The substrate gripping apparatus 20 grips a disk-shaped wafer 22 supported on a substrate support member 21. The substrate gripping apparatus 20 includes robot hands 23 and an articulated robot 24 capable of operating the robot hand 23. The articulated robot 24 is a robot hand driving means for driving the robot hands 23 for displacement. In this embodiment, the substrate gripping apparatus 20 includes a plurality of robot hands 23. The wafer 22 is supported on the substrate support member 21 with one of its major surfaces in contact with the substrate support member 21. For example, the substrate support member 21 is included in a wafer processing system for processing the wafer 22 to support the wafer 22 thereon. The substrate support member 21 may be a container capable of holding a plurality of wafers 22, namely, the so-called wafer cassette.

The robot hands 23 are joined to the articulated robot 24. Each robot hand 23 gripping the wafer 22 is driven for movement by the articulated robot 24 to move the wafer 22 along a predetermined moving path. The robot hand 23 has a predetermined reference axis J1. The robot hand 23 grips the wafer 22 with the axis of the wafer 22 aligned with the reference axis J1 and with the major surfaces of the wafer 22 extended perpendicularly to the reference axis J1. In this embodiment, the reference axis J1 of the robot hand 23 is vertical in a state where the substrate gripping apparatus 20 gripping the wafer 22.

The robot hand 23 includes a hand body 30 having the reference axis J1, holding members 40, 41 and 42 and an air cylinder actuator 34. As shown in FIGS. 2 and 3, the hand body 30 has the reference axis J1 and a center axis J2 perpendicular to the reference axis J1. In this embodiment, the center axis J2 of the hand body 30 is horizontal in a state where the substrate gripping apparatus 20 is gripping the wafer 22.

In the present invention, the reference axis J1 extends in an axial direction Z, the center axis J2 extends in a longitudinal direction X, and a lateral direction Y is perpendicular to both the axial direction Z and the longitudinal direction X. A direction in which a radius of an imaginary circle having its center on the reference axis J1 extends is called a radial direction R and a direction along the circumference of the imaginary circle is called a circumferential direction W.

The hand body 30 has a connecting part 31 extending in a first longitudinal direction X1 and a blade 33 extending in a second longitudinal direction X2 opposite the first longitudinal direction X1. The blade 33 is connected to the articulated robot 24 by the connecting part 31. The blade 33 is a thin V-shaped plate symmetrical with respect to the center axis J2. The blade 33 has a base part 37, and bifurcate end parts 38 and 39 extending from the base part 37 in the second longitudinal direction X2. The base part 37 is connected to the connecting part 31. The end parts 38 and 39 diverge from the base part 37 in the lateral directions Y while advancing along the longitudinal direction X2.

The holding members 40 to 42 are placed on the hand body 30. The holding members 40 to 42 are apart in the radial directions R from the reference axis J1 and are circumferentially spaced apart in the circumferential direction W. The holding members 40 to 42 protrude from the hand body 30 in a first axial direction Z1. The first axial direction Z1 is a direction from the hand body 30 disposed in a space on one side of the wafer 22 supported on the substrate support member 21 opposite a space on the other side of the substrate in which the substrate support member is disposed, toward the substrate support member 21. In this embodiment, the first axial direction Z1 is a vertically downward direction.

The two holding members 40 and 41 are fixed holding members and the holding member 42 is a movable holding member. The fixed holding members 40 and 41 are fixed to the end parts 38 and 39 of the blade 33, respectively. The fixed holding members 40 and 41 are symmetrical with respect to the center axis J2. The fixed holding members 40 and 41 are spaced by a distance approximately equal to the radius of the wafer 22 to be gripped apart from the reference axis J1 in the radial directions R. A straight line connecting the fixed holding member 40 and the reference axis J1 and a straight line connecting the other fixed holding member 41 and the reference axis J1 form an angle not greater than 180°. An angle between the straight line connecting the fixed holding member 40 and the reference axis J1, and the center axis J2, and an angle between the straight line connecting the other fixed holding member 41 and the reference axis J1, and the center axis J2 are less than 90°. For example, those angles are 25°.

The movable holding member 42 has a movable holder first guide part 60. The movable holder first guide part 60 can be moved relative to the hand body 30 toward and away from the reference axis J1. In this embodiment, the movable holder first guide part 60 moves along the center axis J2. The holding members 40 to 42 cooperate to hold the wafer 22 by the peripheral parts 19 of the wafer 22 and to release the wafer 22.

The air cylinder actuator 34 is a movable holding member driving means for moving the movable holder first guide part 60 of the movable holding member 42 in opposite directions. Compressed air is supplied to the air cylinder actuator 34 to move a piston rod 36 along the center axis J2. The movable holder first guide part 60 of the movable holding member 42 is connected to the free end of the piston rod 36 by a coupling device 35. When the piston rod 36 is projected from the cylinder of the air cylinder actuator 34, the movable holder first guide part 60 of the movable holding member 42 moves along the center axis J2 toward the reference axis J1. When the piston rod 36 is retracted into the cylinder, the movable holder first guide part 60 of the movable holding member 42 is moved along the center axis J2 away from the reference axis J1. In this embodiment, the piston rod 36 is pushed toward the reference axis J1 by a spring 34a, namely, an elastic means. Therefore, the movable holding member 42 is able to keep holding the wafer 22 even if the supply of compressed air to the air cylinder actuator 34 is stopped.

The articulated robot 24 has a robot arm 24a. The robot hand 23 is attached to an end part of the robot arm 24a. The robot arm 24a is driven for movement to move the robot hand 23 to a predetermined position. The articulated robot 24 may be of any construction, provided that the articulated robot 24 is able to move the robot hand 23. For example, the articulated robot 24 is capable of locating the robot hand 23 at a desired position on a cylindrical coordinate system.

The substrate gripping apparatus 20 has a controller 32 for controlling the air cylinder actuator 34 and the articulated robot 24. More specifically, the controller 32 is able to move the robot hand 23 to a desired position by controlling a driving circuit for driving the articulated robot 24. The controller 32 controls a power circuit for supplying compressed air to the air cylinder actuator 34 to move the movable holder first guide part 60 of the movable holding member 42 along the center axis 32.

The controller 32 is, for example, a robot controller. The controller has an arithmetic-logic unit, a storage unit, an input/output unit and a display unit. Storage unit stores predetermined programs. The arithmetic-logic unit executes the programs stored in the storage unit to make the substrate gripping apparatus perform operations including a gripping operation for gripping the wafer 22. The input/output unit sends results of arithmetic-logic operations performed by the arithmetic-logic unit to the driving circuit for driving the articulated robot 24 and the power circuit for driving the air cylinder actuator 34. The input/output unit transmits instructions and programs entered by the operator to the arithmetic-logic unit and the storage unit. The substrate gripping apparatus 20 is provided with an informing device 32a. The informing device is a display, such as a liquid crystal display, or a sounding device capable of radiating acoustic information, such as a loudspeaker. The informing device 32a provides information about working condition indicated by the results of arithmetic-logic operations of the controller 32.

Figure 6:
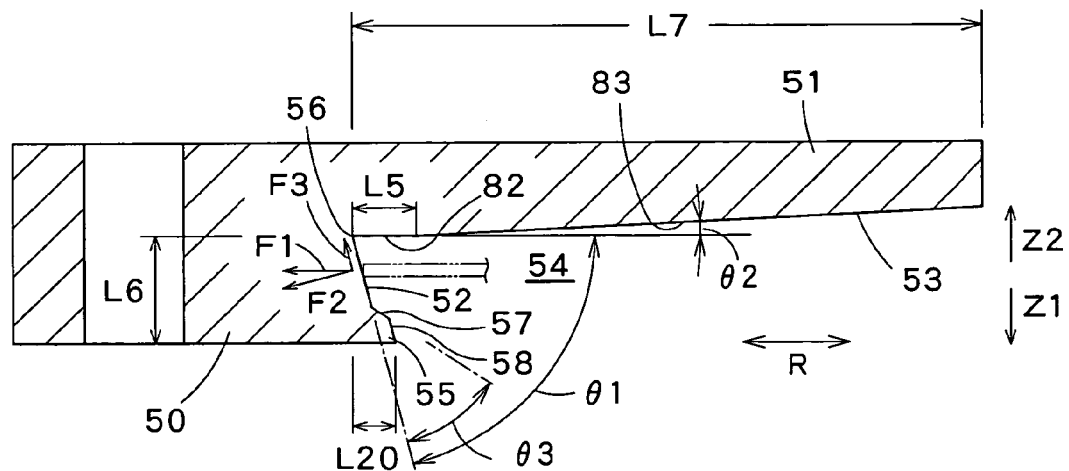
FIG. 6 is a sectional view of one fixed holding member.
Figure 7:
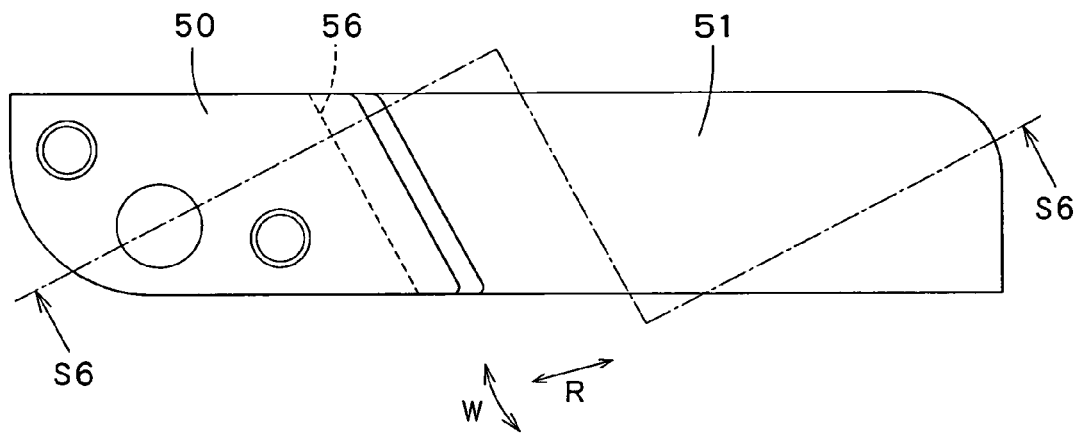
FIG. 7 is a bottom view of the fixed holding member.

FIG. 6 is a sectional view of the fixed holding member 40 on the end part 38 of the blade 33, and FIG. 7 is a bottom view of the fixed holding member 40. FIG. 6 is a sectional view taken on the line S6-S6 in FIG. 7. The fixed holding members 40 and 41 are symmetrical with respect to the center axis J2 and hence only the fixed holding member 40 will be described and the description of the other fixed holding member 41 will be omitted.

The fixed holding member 40 has a substantially L-shaped sectional shape. The fixed holding member 40 has a fixed holder first guide part 50 and a fixed holder second guide part 51. The fixed holder first guide part 50 is fixed to the blade 33 so as to protrude from the blade 33 in the axial direction Z1. The fixed holder second guide part 51 extends from the fixed holder first guide part 50 toward the reference axis J1. The fixed holder first guide part 50 has a fixed holder first guide surface 52 that faces the wafer 22 from below the wafer 22 when the wafer 22 is gripped by the robot hand 23 positioned above the wafer 22. The fixed holder second guide part 51 has a fixed holder second guide surface 53 that faces the wafer 22 from above the wafer 22 when the wafer 22 is gripped by the robot hand 23 positioned above the wafer 22. The fixed holder first guide part 50 and the fixed holder second guide part 51 are integrally united together.

The fixed holder first guide surface 52 obliquely extends upward so as to be gradually apart from the reference axis J1 with advancing along the second axial direction Z2. The fixed holder second guide surface 53 extends obliquely downward in the first axial direction Z1 so as to be gradually apart from the reference axis J1. The fixed holder first guide surface 52 and the fixed holder second guide surface 53 extend in the circumferential direction W about the reference axis J1. The fixed holder first guide surface 52 and the fixed holder second guide surface 53 of the fixed holding member 40 define a V-shaped groove 54 opening toward the reference axis J1.

The V-shaped groove 54 has a shape conforming to a peripheral part 19 of the wafer 22 and extending in the circumferential direction W about the reference axis J1.

The line 56 of intersection of the fixed holder first guide surface 52 and the fixed holder second guide surface 53 touches an imaginary circle of a radius substantially equal to the radius of the wafer 22. The fixed holder second guide surface 53 has a positioning surface 82 continuous with the fixed holder first guide surface 52, and an inclined surface 83 extending from the positioning surface 82 toward the reference axis J1. The positioning surface 82 is perpendicular t the reference axis J1. The inclined surface 83 slopes upward in the second axial direction Z2 so as to gradually approach to the reference axis J1.

A fixed holder first angle $\theta 1$ between the fixed holder first guide surface 52 and an imaginary plane perpendicular to the reference axis 31 is below 90°. When the wafer 22 is pressed against the fixed holder first guide surface 52 in a radially outward direction perpendicular to the reference axis J1 by a force F1 after the peripheral part 19 has been brought into contact with the fixed holder first guide surface 52, the force F1 is decomposed into a force F2 acting in a direction perpendicular to the fixed holder first guide surface 52 and a force F3 acting in a direction parallel to the fixed holder first guide surface 52. The force F3 acting in a direction parallel to the fixed holder first guide surface 52 causes the wafer 22 to slide toward the fixed holder second guide surface 53. The force acting in a direction perpendicular to the fixed holder first guide surface 52 generates a frictional force that opposes the sliding of the wafer 22 relative to the fixed holder first guide surface 52. The wafer 22 is unable to slide smoothly along the fixed holder first guide surface 52 if the fixed holder first angle $\theta 1$ is excessively large. The wafer 22 needs to slide a long distance upward along the fixed holder first guide surface 52 if the fixed holder first angle $\theta 1$ is excessively small. Therefore, the fixed holder first angle $\theta 1$ is determined such that the wafer 22 is able to slide smoothly along the fixed holder first guide surface 52 and the distance of sliding movement of the wafer 22 is not excessively long. More concretely, the fixed holder first angle $\theta 1$ is not smaller than 60° and less than 90°. Preferably, the fixed holder first angle $\theta 1$ is 75°.

The fixed holder first guide part 50 is provided with a protrusion 55 at its free end. The protrusion 55 protrudes from the fixed holder first guide surface 52 toward the reference axis 31. The protrusion 55 has a first protruding surface 57 continuous with the first guide surface 52 of the fixed holder first guide part 50, and a second protruding surface 58 continuous with the first protruding surface 57 and extending in the first axial direction Z1. The first protruding surface 57 is inclined so as to approach the reference axis J1 in the radial direction R with advancing in the first axial direction Z1. An angle $\theta 3$ between the first protruding surface 57 and the fixed holder first guide surface 52 is not smaller than 35° and less than 55°. Preferably, the angle $\theta 3$ is 45°. An angle between the second protruding surface 58 and a plane perpendicular to the reference axis 31 is equal to the fixed holder first angle $\theta 1$. The protrusion 55 prevents the wafer 22 from slipping off the fixed holding member 40.

An unprocessed area is formed in the peripheral part 19 of the wafer 22. The unprocessed area has a radial width, namely, a width from the circumference of the wafer 22 to a circle inside the wafer 22. The unprocessed area is removed after the completion of a wafer processing process. The positioning surface 82 of the fixed holder second guide surface 53 has a radial width L5 smaller than the radial width of the unprocessed area. For example, the radial width L5 of the positioning surface 82 is 2 mm.

The inclined surface 83 of the fixed holder second guide surface 53 is inclined to an imaginary plane perpendicular to the reference axis J1 at a small fixed holder second angle $\theta 2$ of, for example, 3° to enable the wafer slide smoothly along the fixed holder second guide surface 53. The fixed holder first guide surface 52 has an axial dimension L6 is greater than an axial distance along the axial direction Z by which the robot hand 23 may possibly be dislocated relative to the wafer 22. The fixed holder second guide surface 53 has a radial dimension L7 greater than a radial distance along the radial direction R by which the robot hand 23 may possibly be dislocated relative to the wafer 22.

As shown in FIG. 1, the movable holding member 42 on the side of the base part has a movable holder first guide part 60 and two movable holder second guide parts 61. The movable holder first guide part 60 is held on the piston rod 36 so as to protrude from the blade 33 in the first axial direction Z1. The second guide parts 61 are fixed to the blade 33 so as to protrude from the blade 33 in the first axial direction Z1 and to extend in the radial direction R. The movable holder first guide part 60 is a movable part of the movable holding member 42.

The movable holder first guide part 60 has a movable holder first guide surface 62 opposed to the wafer 22 and extending from below the wafer 22 in a state where the wafer 22 is gripped by the robot hand 23 positioned above the wafer 22. Each of the second guide parts 61 has a movable holder movable holder second guide surface 63 opposed to the wafer 22 from above the wafer 22 in a state where the wafer 22 is gripped by the robot hand 23 positioned above the wafer 22. The movable holder first guide part 60 and the second guide parts 61 are separate parts. An angle formed by a straight line connecting the movable holding member 42 and the reference axis J1 and each of straight lines respectively connecting the fixed holding members 40 and 41 and the reference axis J1 is not greater than 180°. Thus, the wafer 22 can be surely gripped.

Figure 8:
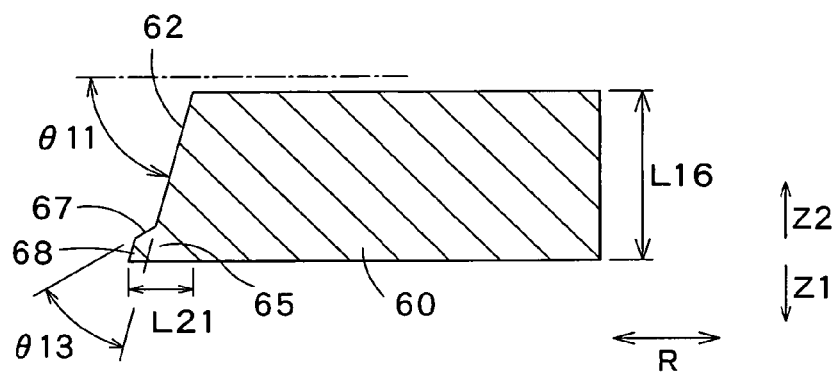
FIG. 8 is a sectional view of a fixed holder first guide part of a fixed holding member.
Figure 9:
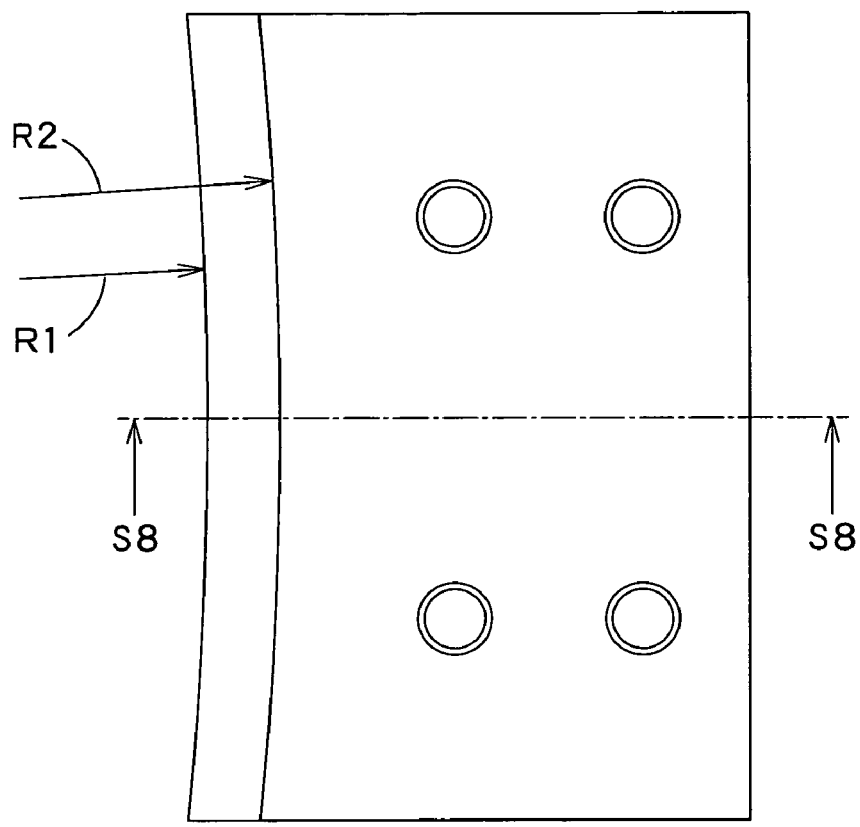
FIG. 9 is a plan view of the movable holder first guide part.

FIGS. 8 and 9 are a sectional view and a plan view, respectively, of the movable holder first guide part 60. FIG. 8 is a sectional view of the movable holder first guide part 60 taken on the line S8-S8 in FIG. 9. The movable holder first guide part 60 is disposed on the center axis J2. The piston rod 36 is moved axially to move the movable holder first guide part 60 along the center axis J2.

The movable holder first guide surface 62 is inclined so as to be gradually apart from the reference axis J1 with advancing along the second axial direction Z2. The movable holder first guide surface 62 extends in the circumferential direction W in an arc of a circle having its center on the reference axis J1. An edge of an end with respect to the first axial direction Z1 of the movable holder first guide surface 62 has a radius R1 of curvature smaller than the radius of the wafer 22. An edge of an end with respect to the second axial direction Z2 of the movable holder first guide surface 62 has a radius R2 of curvature greater than the radius of the wafer 22.

A movable holder first angle $\theta 11$ formed by the movable holder first guide surface 62 and an imaginary plane perpendicular to the reference axis J1 is equal to the fixed holder first angle $\theta 1$. The movable holder first guide part 60 is provided with a protrusion 65 at its free end. The protrusion 65 protrudes from the first guide surface 60 toward the reference axis J1.

The protrusion 65 has a first protruding surface 67 continuous with the movable holder first guide part 60, and a second protruding surface 68 continuous with the first protruding surface 67 and extending in the first axial direction Z1. The first protruding surface 67 is inclined so as to approach the reference axis J1 with advancing in the first axial direction Z1. An angle θ13 between the first protruding surface 67 and the movable holder first guide surface 62 is equal to the angle θ3. An angle between the second protruding surface 68 and a plane perpendicular to the reference axis J1 is equal to the movable holder first angle θ11. The first guide surface has an axial dimension L16 greater than a distance by which the robot hand 23 may be dislocated in the axial direction Z with respect to the wafer 22.

Figure 10:
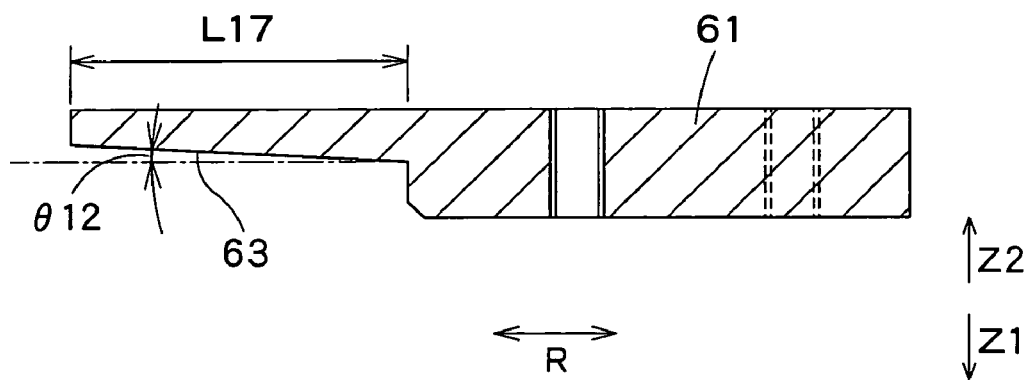
FIG. 10 is a sectional view of a movable holder second guide part of the movable holding member.
Figure 11:
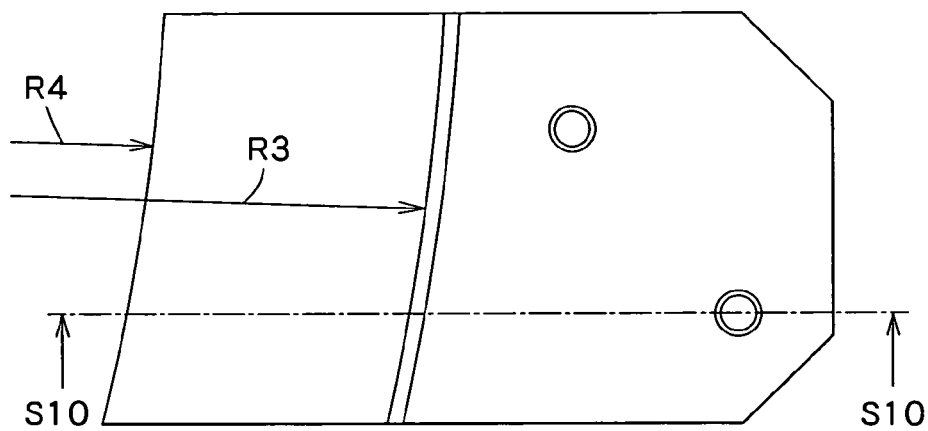
FIG. 11 is a plan view of the movable holder second guide part of the movable holding member.

FIGS. 10 and 11 are a sectional view and a plan view, respectively, of the movable holder movable holder second guide part 61. FIG. 10 is a sectional view of the movable holder second guide part 61 taken on the line S10-S10 in FIG. 11. The two second guide parts 61 are disposed respectively on the opposite sides, with respect to the circumferential direction W, of the movable holder first guide part 60. The second guide parts 61 are fixed to the blade 33.

A movable holder movable holder second guide surface 63 declines so as to be gradually apart from the reference axis J1 with advancing in the first axial directing Z1. The movable holder second guide surface 63 extends in the circumferential direction W along an arc of a circle having its center on the reference axis J1. An edge of an end with respect to the first axial direction Z1 of the movable holder second guide surface 63 has a radius R3 of curvature greater than the radius of the wafer 22. An edge of an end with respect to the second axial direction Z2 of the second guide surface 62 has a radius R4 of curvature smaller than the radius of the wafer 22.

The movable holder second guide surface 63 is inclined to an imaginary plane perpendicular to the reference axis J1 at a small movable holder second angle θ12. The movable holder second angle θ12 is equal to the fixed holder second angle θ2. The movable holder second guide surface 63 has a radial dimension L17 greater than a distance by which the robot hand 23 may be dislocated in the radial direction R relative to the wafer 22.

As shown in FIG. 1, the movable holder first guide surface 62 and the movable holder second guide surface 63 define a V-shaped groove 64 opening toward the reference axis 31. The V-shaped groove 54 is capable of receiving a peripheral part 19 of the wafer 22 and extends in the circumferential direction W about the reference axis J1. Suppose that an imaginary circle of a diameter equal to that of the wafer 22 is perpendicular to the reference axis J1 and has an axis aligned with the reference axis J1. When the imaginary circle touches the line 56 of intersection of the fixed holder first guide surface 52 and the fixed holder second guide surface 53, the imaginary circle touches the movable holder second guide surface 63. Thus the wafer 22 can be correctly positioned with respect to the reference axis J1 by holding the wafer 22 by the holding members 40 to 42. When the peripheral parts 19 of the wafer 22 are in contact with the second guide surfaces 53 and 63, a space is formed between the hand body 30 and the wafer 22. Since the movable holder second guide parts 61 are fixed to the blade 33, the wafer 22 can be guided regardless of the position of the movable holder first guide part 60, and the wafer 22 can be prevented from directly touching the blade 33.

Figure 12:
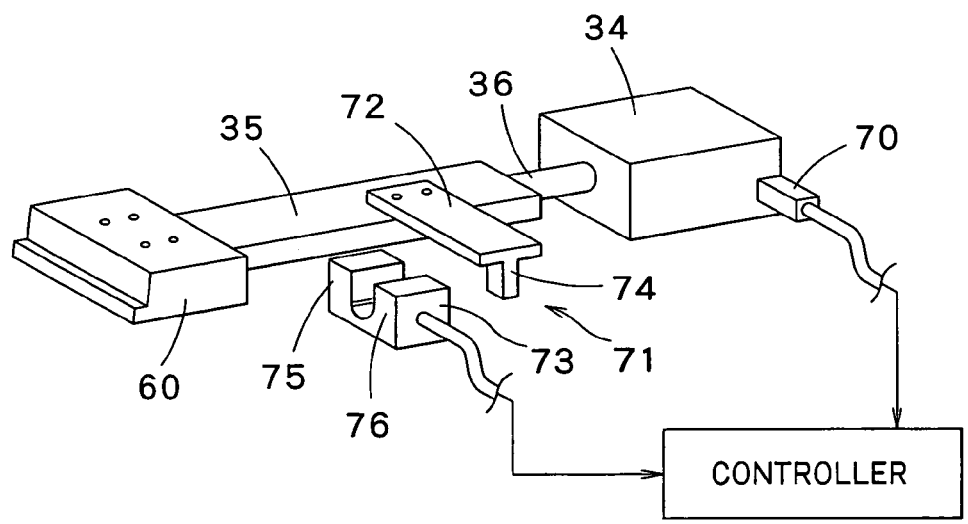
FIG. 12 is a perspective view of an air cylinder actuator.
Figure 13:
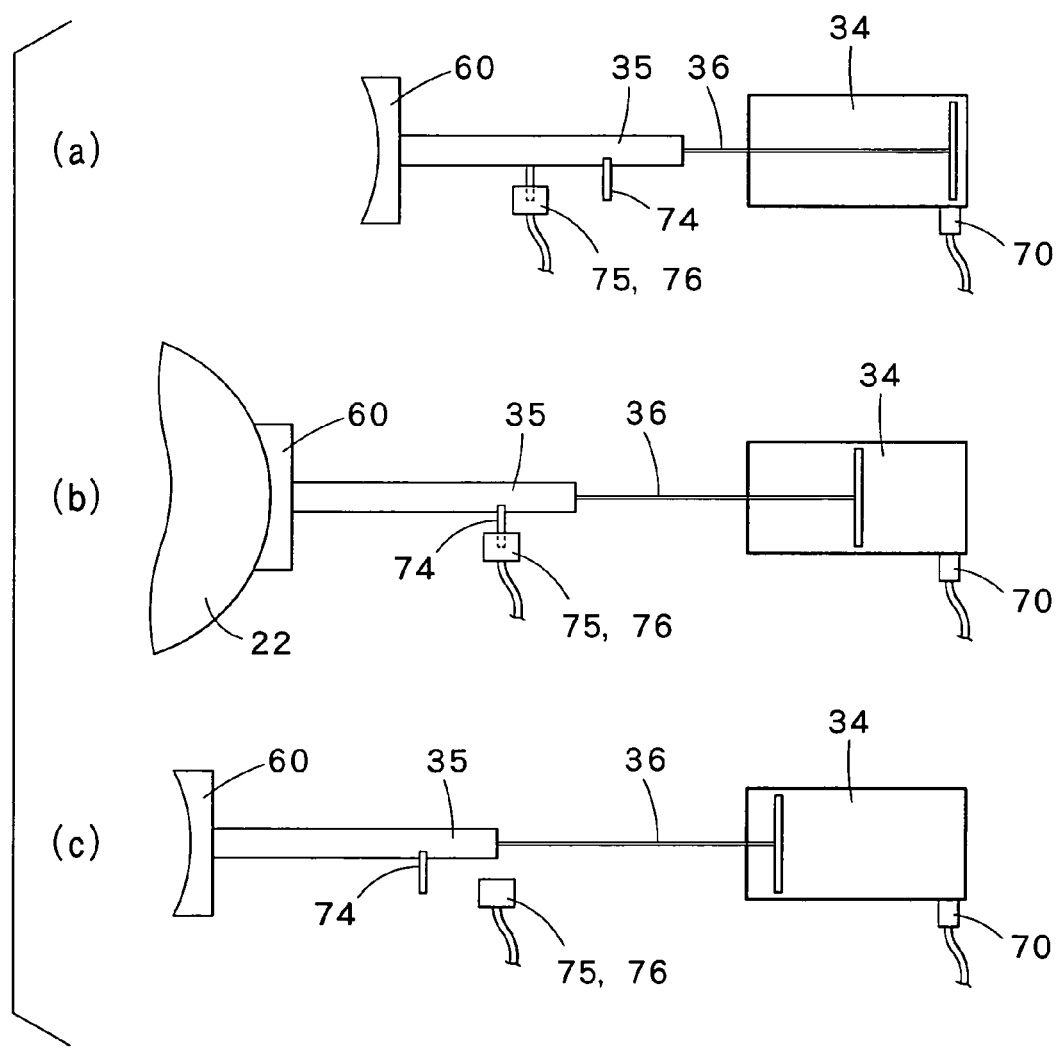
FIGS. 13(a) to 13(c) are typical views of assistance in explaining the displacement of the movable holder first guide part.

FIG. 12 is a perspective view of the air cylinder actuator 34;

FIG. 13 is a typical view of assistance in explaining the displacement of the movable holder first guide part 60. FIG. 13(a) shows the movable holder first guide part 60 arrived at its home position being apart from the reference axis J1 by a distance longer than the radius of the wafer 22 in the radial direction R. FIG. 13(b) shows the movable holder first guide part 60 at a gripping position where the movable holder first guide part 60 holds the wafer 22. FIG. 13(c) shows the movable holder first guide part 60 advanced toward the reference axis J1 beyond the holding position.

The movable holder first guide part 60 is fixedly connected to the free end of the piston rod 36 by the coupling device 35. The substrate gripping apparatus 20 is provided with a retracted guide part detector 70 for detecting the movable holder first guide part 60 arrived at the home position and an advanced guide part detector 71 for detecting the movable holder first guide part 60 arrived at the gripping position.

The retracted guide part detector 70 detects the movable holder first guide part 60 when the movable holder first guide part 60 is moved away from the reference axis J1 and arrives at the home position at a distance longer than the radius of the wafer 22 from the reference axis J1. Practically, the retracted guide part detector 70 is limit switch. The limit switch is attached to the cylinder of the air cylinder actuator 34 to detect the piston arrived at back limit position the farthest from the reference axis J1. When the piston rod 36 is fully retracted apart from the reference axis J1 as shown in FIG. 13(a), the piston is opposed to the limit switch. In this state, the limit switch sends an on-signal indicating that the movable holder first guide part 60 is at the home position to the controller 32. When the piston is not opposed to the limit switch, the limit switch sends an off-signal indicating that the movable holder first guide part 60 is not at the home position.

The advanced guide part detector 71 includes an actuator 72 and a sensor 73. The actuator 72 is fixed to the coupling device 35 and moves together with the coupling device 35. The sensor 73 is fixed to the connecting part 31. The sensor 73 generates a signal when a projection 74 formed on the actuator 72 is opposed to the sensor 73. In this embodiment, the actuator 73 is positioned on the connecting part 31 such that the projection 74 of the actuator 72 coincides with the sensor 73 when the movable holder first guide part 60 arrives at the gripping position.

For example, the sensor 73 is an optical sensor. The sensor 73 has a substantially U-shaped block having circumferentially opposite arms defining a groove extending along the center axis J2, a light projector 75 mounted on one of the arms of the block, and a light receiver mounted on the other arm. When the movable holder first guide part 60 is at a position other than the gripping position, a light beam projected by the light projector 75 falls on the light receiver 76. The light receiver 76 sends a signal indicating that the light beam is intercepted by the projection 74 to the controller 32.

Referring to FIG. 13(b), the projection 74 of the actuator 72 enters the groove of the sensor 73 upon the arrival of the movable holder first guide part 60 at the gripping position. Consequently, the light beam projected by the light projector 75 is intercepted by the projection 74 of the actuator 72 and is unable to fall on the light receiver 76. When the light receiver 76 is in such a screened state, the controller 32 decides that the movable holder first guide part 60 has arrived at the gripping position. When the movable holder first guide part 60 is advanced toward the reference axis 31 beyond the gripping position as shown in FIG. 13(c) or when the movable holder first guide part 60 is behind the gripping position with respect to the reference axis 31, the light receiver 76 receives the light beam. Then, the controller 32 decides that the movable holder first guide part 60 is not at the gripping position.

Figure 14:
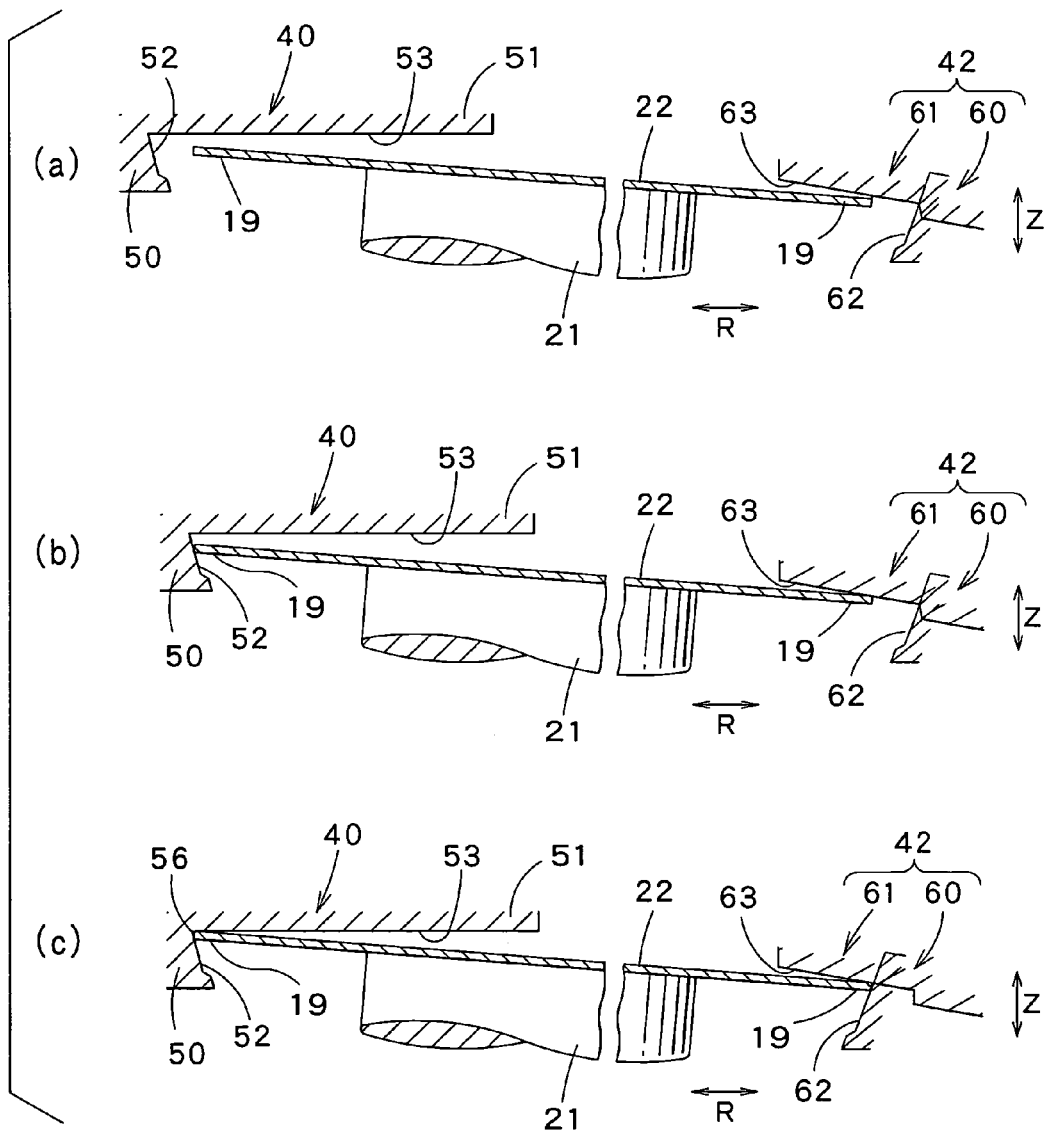
FIGS. 14(a) to 14(c) are typical sectional views of assistance in explaining a wafer gripping operation.

FIG. 14 is a typical sectional view of assistance in explaining a wafer gripping operation for gripping the wafer 22. FIG. 14(a) shows the holding members 40 to 42 arranged so that the holding members 40 to 42 are radially spaced from the peripheral parts 19 of the wafer 22. FIG. 14(b) shows the fixed holding member 40 in engagement with the peripheral part 19 of the wafer 22. FIG. 14(c) shows the holding members 40 to 42 in engagement with the peripheral parts 19 of the wafer 22.

The controller 32 executes the predetermined program to accomplish the wafer gripping operation for gripping the wafer 22. Position data on the position of the wafer 22 supported on the substrate support member 21 is stored beforehand in the controller 32.

The controller 32 controls the articulated robot 24 to carry out the wafer gripping operation. The robot hand 23 is moved toward the wafer 22 in a space on one side of the wafer 22 opposite a space on the other side of the wafer 22 in which the substrate support member 21 is disposed, i.e., the robot hand 23 is moved toward the wafer 22 from above the wafer 22, to place the holding members 40 to 42 opposite to the peripheral parts 19 of the wafer 22 as shown in FIG. 14(a). At this stage, the holding members 40 to 42 are radially spaced apart from the peripheral parts 19 of the wafer 22.

Subsequently, the articulated robot 24 displaces the robot hand 23 to move the fixed holding members 40 and 41 toward the peripheral parts 19 of the wafer 22 and, at the same time, the air cylinder actuator 34 displaces the movable holder first guide part 60 to bring the movable holder first guide surface 62 near to the peripheral part 19 of the wafer as shown in FIG. 14(a). Finally, the holding members 40 to 42 are engaged with the peripheral parts 19 of the wafer 22, respectively.

When the movable holder first guide surface 62 has been engaged with the wafer 22, and the movable holder first guide part 60 is further moved toward the reference axis J1, the peripheral parts 19 of the wafer 22 slides along the fixed holder first guide surface 52 of the holding members 40 and 41 and, finally, each of the peripheral parts 19 of the wafer 22 is positioned on the line 56 of intersection of the fixed holder first guide surface 52 of the fixed holder first guide part 50 and the fixed holder second guide surface 53 of the fixed holder second guide part 51 of each of the fixed holding members 40 and 41 as shown in FIG. 14(c).

When each of the peripheral parts 19 of the wafer 22 are near the line 56 of the fixed holder first guide surface 52 of the fixed holder first guide part 50 and the fixed holder second guide surface 53 of the fixed holder second guide part 51 of each of the fixed holding members 40 and 41, the wafer 22 is restrained from moving in the radial directions R about the reference axis 11 and the axial directions Z and the robot hand 23 is able to grip the wafer 22. The wafer 22 can be located with its axis aligned with the reference axis J1 in a position perpendicular to the reference axis J1.

This embodiment needs to separate the wafer 22 from the substrate support member 21 against resistance acting on the wafer 22 to hold the wafer 22 on the substrate support member 21. When the resistance acts on the wafer 22, the wafer 22 tends to slide down along the first guide surfaces 52 and 62 and the peripheral parts 19 come into contact with the protrusions 55 and 65 of the first guide parts 50 and 60. Thus, the wafer 22 is restrained from slipping off the first guide parts 50 and 60 and hence the wafer 22 can be gripped with reliability.

Since the wafer 22 can be prevented from slipping off the holding members 40 to 42 by the protrusions 55 and 65, the fixed holder first angle θ1 and the movable holder first angle θ11 do not need to be small angles and may be large angles near 90°. Consequently, the radial dimensions L20 and L21 of the first guide surface 50 and 60 may be small and the first guide parts 50 and 60 can be easily extended under the lower surface of the wafer 22.

The wafer 22 can be set perpendicularly to the reference axis 31 by bringing the upper surfaces of the peripheral parts 19 of the wafer 22 into contact with the positioning surfaces 82. Since the positioning surfaces 82 have the radial width L5 smaller than the radial width of the unprocessed areas of the wafer 22, only the unprocessed areas of the wafer 22 touch the positioning surfaces 82 and processed areas of the wafer 22 can be prevented from being damaged.

Since the angular intervals between the holding members 40 to 42 are below 180°, the wafer 22 can be gripped with its axis aligned with the reference axis J1. The wafer 22 is positioned with its axis aligned with the reference axis J1 and set in a position perpendicular to the reference axis J1 by placing each of the peripheral parts 19 on the line 56 of intersection of the fixed holder first guide surface 52 and the fixed holder second guide surface 53 and the peripheral part 19 in contact with the movable holder second guide surface 62. Thus the wafer 22 can be easily positioned on and gripped by the robot hand 23 simply by holding the wafer 22 by the holding members 40 to 42.

Figure 15:
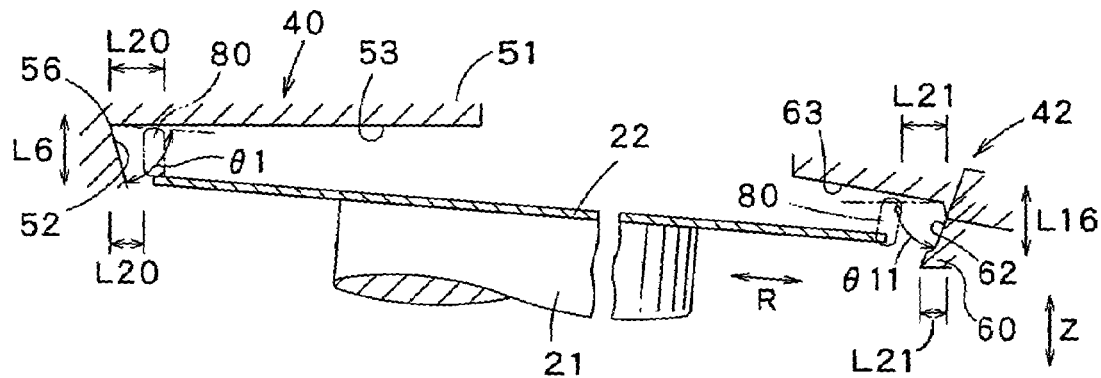
FIG. 15 is a schematic sectional view of the holding members dislocated in an axial direction Z with respect to a wafer.
Figure 16:
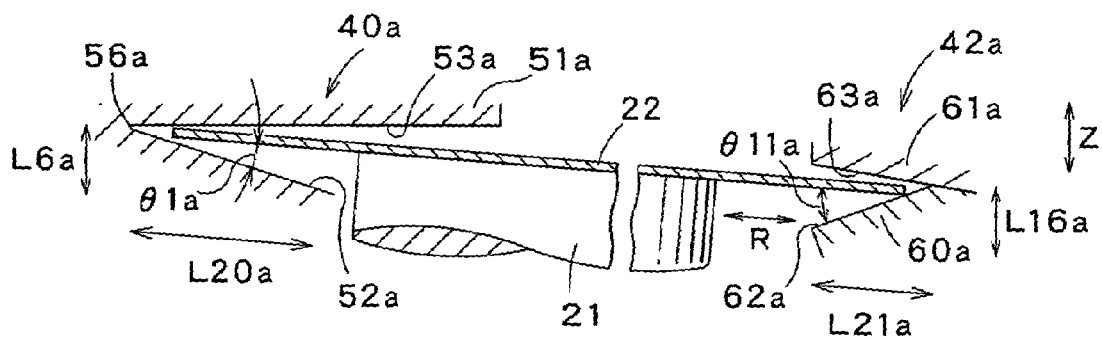
FIG. 16 is a schematic sectional view of holding members included in a first comparative example.

FIG. 15 is a schematic sectional view of the holding members 40 to 42 dislocated in the axial direction Z with respect to the wafer 22. FIG. 16 is a schematic sectional view of holding members 40a and 42a included in a first comparative example. In the first comparative example, first angles θ1a and θ1a respectively between the first guide surface 52a of the holding member 40a and an imaginary plane perpendicular to the reference axis J1 and between the first guide surface 62a of the holding member 42a and the imaginary plane perpendicular to the reference axis J1 are small.

In the preferred embodiment, the respective axial dimensions L6 and L16 of the first guide surfaces 52 and 62 are greater than the dimension of a capture range 80 in which the robot hand 23 is able to grip the wafer 22 even if the robot hand 23 is dislocated in the axial directions Z relative to the wafer 22. Therefore, the substrate gripping apparatus is able to grip the wafer 22 even if the peripheral part 19 of the wafer 22 is dislocated in the axial direction Z as shown in FIG. 15. The first guide surfaces 52 and 62 can be formed in the small radial dimensions L20 and L21, respectively, by increasing the first angles θ1a and θ1a respectively between the first guide surface 52 and an imaginary plane perpendicular to the reference axis J1 and between the first guide surface 62 and the imaginary plane perpendicular to the reference axis J1 to the largest possible extent after determining the respective axial dimensions L6 and L16 of the first guide surfaces 52 and 62.

When the first angles θ1a and θ1a are small and the respective axial dimensions L6a and L16a of the first guide surfaces 52a and 62a are fixed in the first comparative example shown in FIG. 16, the radial dimensions L20a and L21a are inevitably large. In the first comparative example, the robot hand 23 needs to be moved a long distance in the radial direction R before the wafer 22 is brought into contact with the line 56a of intersection of the first guide surface 52a and the second guide surface 53a.

Since the axial dimensions L20 and L21 of the first guide surfaces 52 and 62 are small in the substrate gripping apparatus in the preferred embodiment, the wafer 22 can be brought into contact with the line 56 of intersection of the first guide surface 52 and the second guide surface 53 by moving the robot hand 23 by a short distance in the radial direction R. The first guide surface 52 along which the peripheral par 19 of the wafer 22 slides can be formed in a short length.

Figure 17:
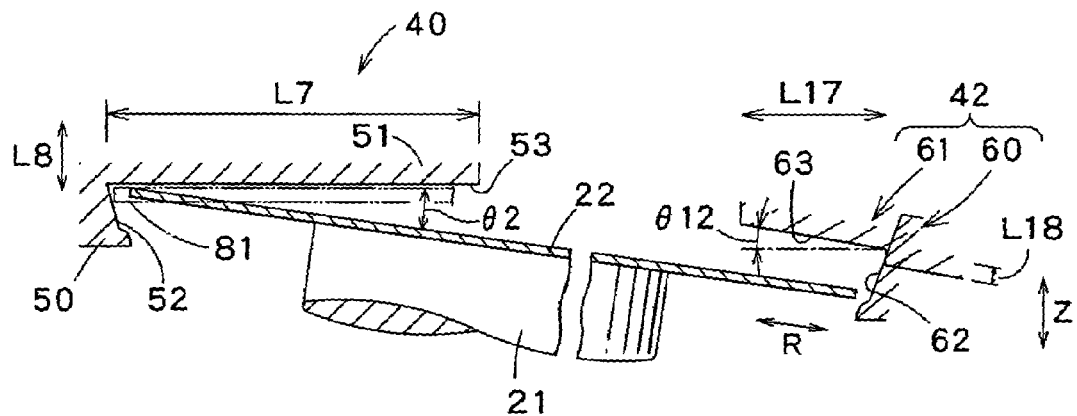
FIG. 17 is a schematic sectional view of holding members dislocated in a radial direction R with respect to a wafer.
Figure 18:
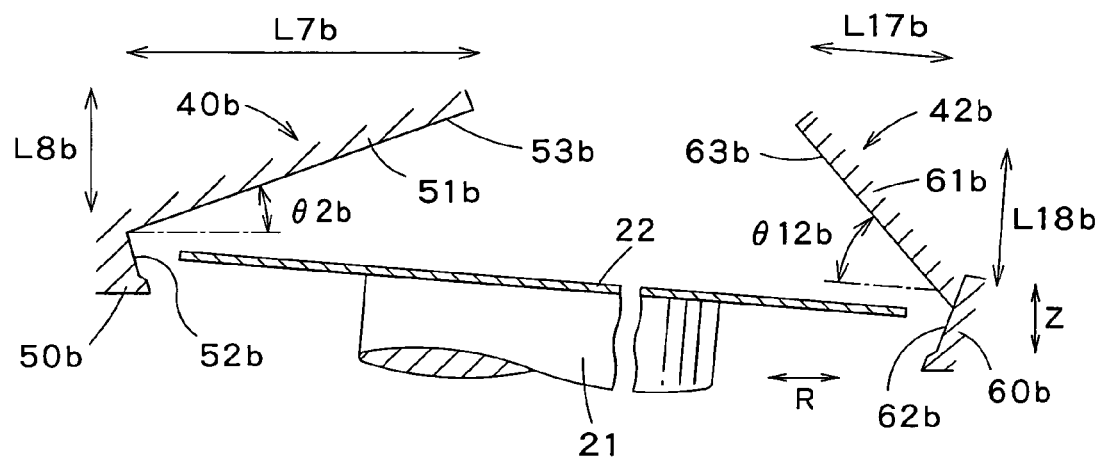
FIG. 18 is a schematic sectional view of holding members included in a second comparative example.
Figure 19:
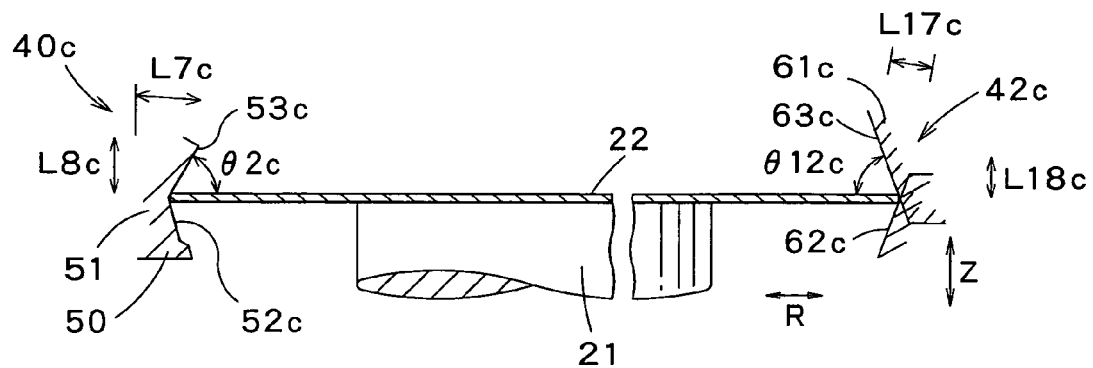
FIG. 19 is a schematic sectional view of holding members included in a third comparative example.

FIG. 17 is a schematic sectional view of the holding members 40 to 42 dislocated in the radial direction R with respect to the wafer 22. FIG. 18 is a schematic sectional view of holding members 40b and 42b included in a second comparative example. FIG. 19 is a schematic sectional view of holding members 40c and 42c included in a third comparative example. In the second comparative example, angles θ2b and θ12b respectively between a second guide surface 53b and an imaginary plane perpendicular to the reference axis 31 and between a second guide surface 63b and the imaginary plane perpendicular to the reference axis J1 are large and axial dimensions L8b and L18b are large. In the third comparative example, angles θ2c and θ12c respectively between a second guide surface 53c and an imaginary plane perpendicular to the reference axis J1 and between a second guide surface 63c and the imaginary plane perpendicular to the reference axis 31 are large and axial dimensions L8c and L18c are large.

In the substrate gripping apparatus in this embodiment, the respective radial dimensions L7 and L17 of the second guide surfaces 53 and 63 are greater than the dimension of a range in which the robot hand 23 is dislocated in the radial directions R relative to the wafer 22. Thus, as shown in FIG. 17, the substrate gripping apparatus is able to grip the wafer 22 even if the wafer 22 is dislocated in the radial direction R as shown in FIG. 17. The second guide surfaces 53 and 63 can be formed in small radial dimensions L8 and L18, respectively, by decreasing the second angles θ and θ12 respectively between the second guide surface 53 and an imaginary plane perpendicular to the reference axis J1 and between the second guide surface 63 and the imaginary plane perpendicular to the reference axis J1 to the smallest possible extent after determining the respective axial dimensions L8 and L18 of the second guide surfaces 53 and 63. The distance between the robot hand 23 and the gripped wafer 22 can be reduced and the robot hand 23 can be formed in a small size by forming the second guide surfaces 53 and 63 in the short axial dimensions L8 and L18, respectively.

In the second comparative example shown in FIG. 18, angles θ2b and θ12b respectively between the second guide surface 53b and a plane perpendicular to the reference axis J1 and between the second guide surface 63b and the plane perpendicular to the reference axis J1 are large. Therefore, the second guide surfaces 53b and 63b have large axial dimensions L8b and L18b, respectively, and, consequently, the robot hand 23 is inevitably large. In the third comparative example shown in FIG. 19, the second guide surfaces 53c and 63c have small axial dimensions L8c and L18c, respectively. Consequently, a capture range in which the substrate gripping apparatus is able to grip the wafer 22 even if the peripheral part 19 of the wafer 22 is dislocated in the radial direction R is narrowed.

In the substrate gripping apparatus in the preferred embodiment, the second angles θ2 and θ12 are small. Therefore, a capture range 81 in which the substrate gripping apparatus is able to grip the wafer 22 even if the peripheral part 19 of the wafer 22 is dislocated is widened and the robot hand 23 can be formed in a small size. The peripheral part 19 of the wafer 22 is able to come into point contact with the fixed holder second guide surface 53 by sliding along the inclined surface 83 of the fixed holder second guide surface 53.

In the substrate gripping apparatus in the preferred embodiment, the capture ranges 80 and 81 in which the substrate gripping apparatus 20 is able to grip the wafer 22 even if the hand body 30 is dislocated relative to the wafer 22 can be widened. Therefore, the substrate gripping apparatus 20 is able to grip the wafer 22 even if the operator does not accurately teach a gripping position where the substrate gripping apparatus 20 is to grip the wafer 22. Thus the operator is able to accomplish a position teaching operation easily. The wafer 22 can be gripped even if the wafer 22 is positioned accurately, which reduces the frequency of misgripping and the resultant troubles. The hand body 30 can be formed in a small size and collision of the hand body 30 with other devices can be prevented.

Figure 20:
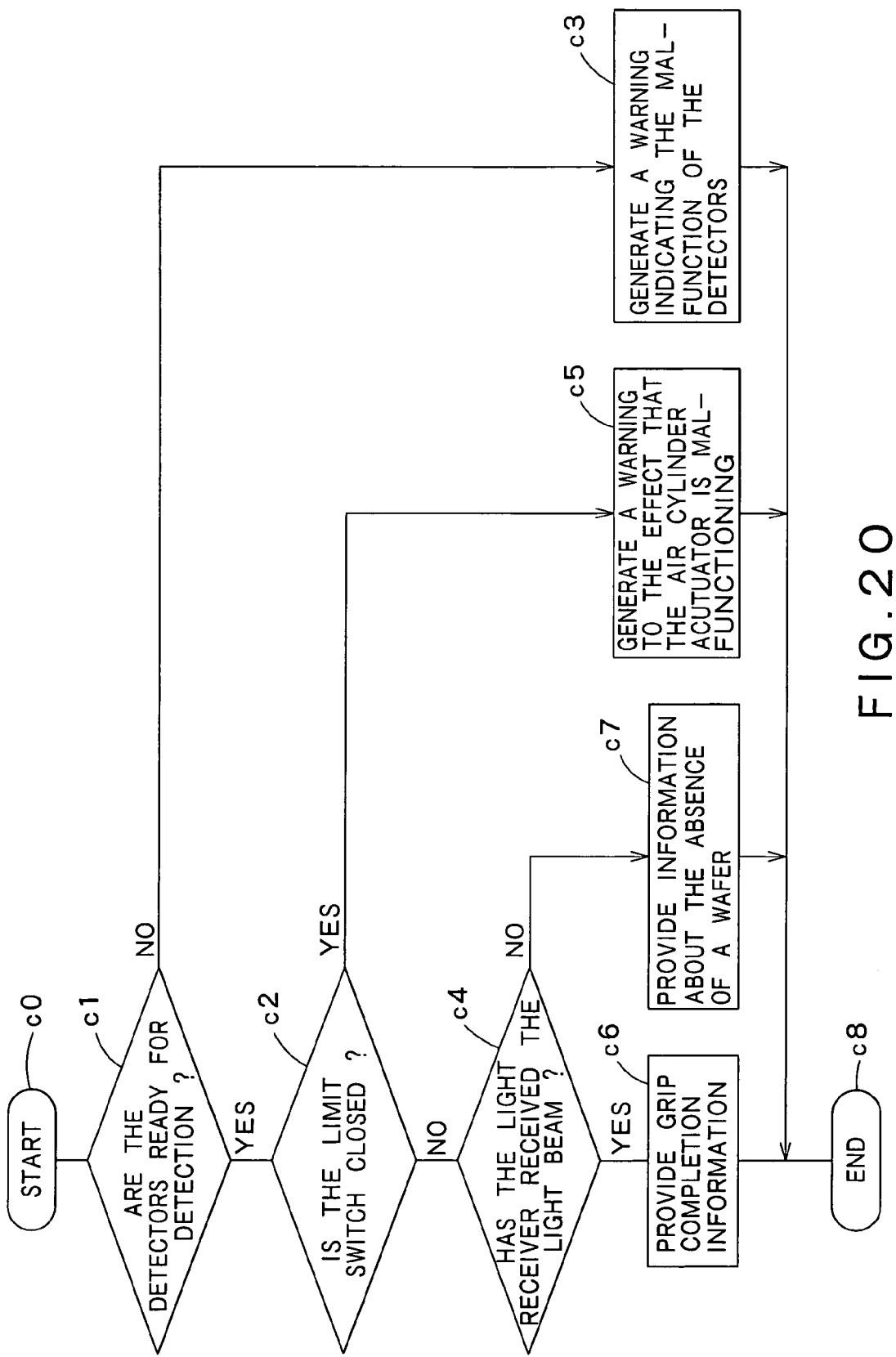
FIG. 20 is a flow chart of a grip confirming operation.

FIG. 20 is a flow chart of a grip confirming operation. The controller 32 performs simultaneously a gripping operation for gripping the wafer 22 and a grip confirming operation for confirming the grip of the wafer 22. Thus troubles that may result from the execution of the gripping operation in a state where the wafer 22 is not supported on the substrate support member 21, can be prevented.

The controller 32 starts the grip confirming operation in step c0 and gives an instruction requesting moving the movable holder first guide part 60 toward the reference axis J1 to the power circuit for driving the air cylinder actuator 34. In step c1, the controller performs the grip confirming operation simultaneously with the gripping operation. The controller 32 gives an instruction requesting a detecting operation to the detectors 70 and 71 to set the detectors 70 and 71 ready for detection. The controller 32 decides that the detectors 70 and 71 are ready for detection and the grip confirming operation goes to step c2 if the controller 32 receives an on-signal from the retracted guide part detector 70 and a light reception signal from the light receiver 76 of the advanced guide part detector 71. Otherwise, the grip confirming operation goes to step c3. In step c3, a warning indicating the malfunction of the detectors 70 and 71 is generated and the controller 32 executes step c8 to end the grip confirming operation.

In step c2, the controller 32 decides if the movable holder first guide part 60 is at the home position on the basis of the signal given thereto by the retracted guide part detector 70 after a time in which the holding members 40 to 42 are expected to accomplish gripping the wafer 22, such as two seconds, has passed since the actuation of the air cylinder actuator 34. The grip confirming operation goes to step c4 if the movable holder first guide part 60 is at the home position or goes to step c5 if the movable holder first guide part 60 is not at the home position. In this embodiment, the grip confirming operation goes to step c4 when the limit switch provides an off-signal or goes to step c5 when the limit switch provides an on-signal. In step c5, the controller 32 decides that the air cylinder actuator 34 is inoperative even if an instruction requesting operation is given to the power circuit for driving the air cylinder actuator 34 and makes the informing device 32a provide information indicating the abnormal condition of the air cylinder actuator 34 and the controller 32 executes step c8 to end the grip confirming operation.

In step c4, the controller 32 decides if the movable holder first guide part 60 is at the gripping position on the basis of a signal given thereto by the advanced guide part detector 71. The grip confirming operation goes to step c6 if the controller 32 decides that the movable holder first guide part 60 is at the gripping position or goes to step c7 if the controller 32 decides that the movable holder first guide part 60 is not at the gripping position.

In step c6, the controller 32 decides that the holding members 40 to 42 are gripping the wafer 22 and makes the informing device 32a provide grip completion information, and then the controller 32 executes step c8 to end the grip confirming operation. In step c7, the controller 32 decides that the wafer 22 is not supported on the substrate support member 21 and makes the informing device 32a provide information to that effect, and then executes step c8 to end the grip confirming operation. It is preferable to end both the grip confirming operation and the gripping operation if the controller 32 decides that the substrate gripping apparatus 20 is in an abnormal condition in step c3, c5 or c7.

Faulty gripping can be prevented when the controller 32 performs the grip confirming operation simultaneously with the gripping operation. For example, the repetition of the gripping operation in a state where the wafer 22 is absent, can be prevented by confirming in step c7 that the wafer 22 is not supported on the substrate support member 21. The useless continuation of the gripping operation in a state where the air cylinder actuator 34 is malfunctioning can be prevented by confirming in step c5 that the air cylinder actuator 34 is malfunctioning. Repair work can be accomplished in a short time by detecting in step c3 that the detectors 70 and 71 are defective.

It is possible to inform the operator of a state where the wafer 22 is not gripped on the basis of signals provided by the detectors 70 and 71. In this embodiment, the gripping operation is performed with the robot hand 23 disposed in a space on one side of the wafer 22 opposite a space on the other side of the wafer 22 in which the substrate support member 21 is disposed. Therefore, in some cases, the operator has difficulty in visually confirming that the holding members 40 to 42 are gripping the wafer 22. As mentioned above, the operator is able to confirm if the wafer 22 is gripped properly from the signals provided by the detectors 70 and 71, which improves the convenience of the substrate gripping apparatus.

FIGS. 21 and 22 are a schematic sectional view and a schematic plan view, respectively, of a substrate processing system 100. The substrate processing system 100 has a processing space 103 of a clean atmosphere containing a reduced amount of dust particles. The substrate processing system 100 has a transfer unit 102 for detachably holding wafer containers 101 for containing wafers 22. A substrate processing apparatus 104 and the substrate gripping apparatus 20 are installed in a process space. For example, the substrate processing apparatus 104 processes the wafer 22 by an oxidation process, an annealing process, a CVD process (chemical vapor deposition process) or a diffusion process. The substrate gripping apparatus 20 transfers a wafer 22 from the wafer container 101 placed in the transfer unit 102 to a desired position in the substrate processing system 100. The substrate gripping apparatus 20 returns the processed wafer 22 to the wafer container 101. The substrate gripping apparatus 20 transfers the wafer 22 from one to another of a plurality of processing units of the substrate processing apparatus 104 according to a predetermined procedure. For example, a plurality of wafers 22 are held in a stack in the wafer container 101. The substrate processing apparatus 104 has the substrate support member 21 for supporting a wafer 22 thereon. For example, the lower surface of the wafer 22 supported on the substrate support member 21 is in contact with the support surface of the substrate support member 21.

Figure 23:
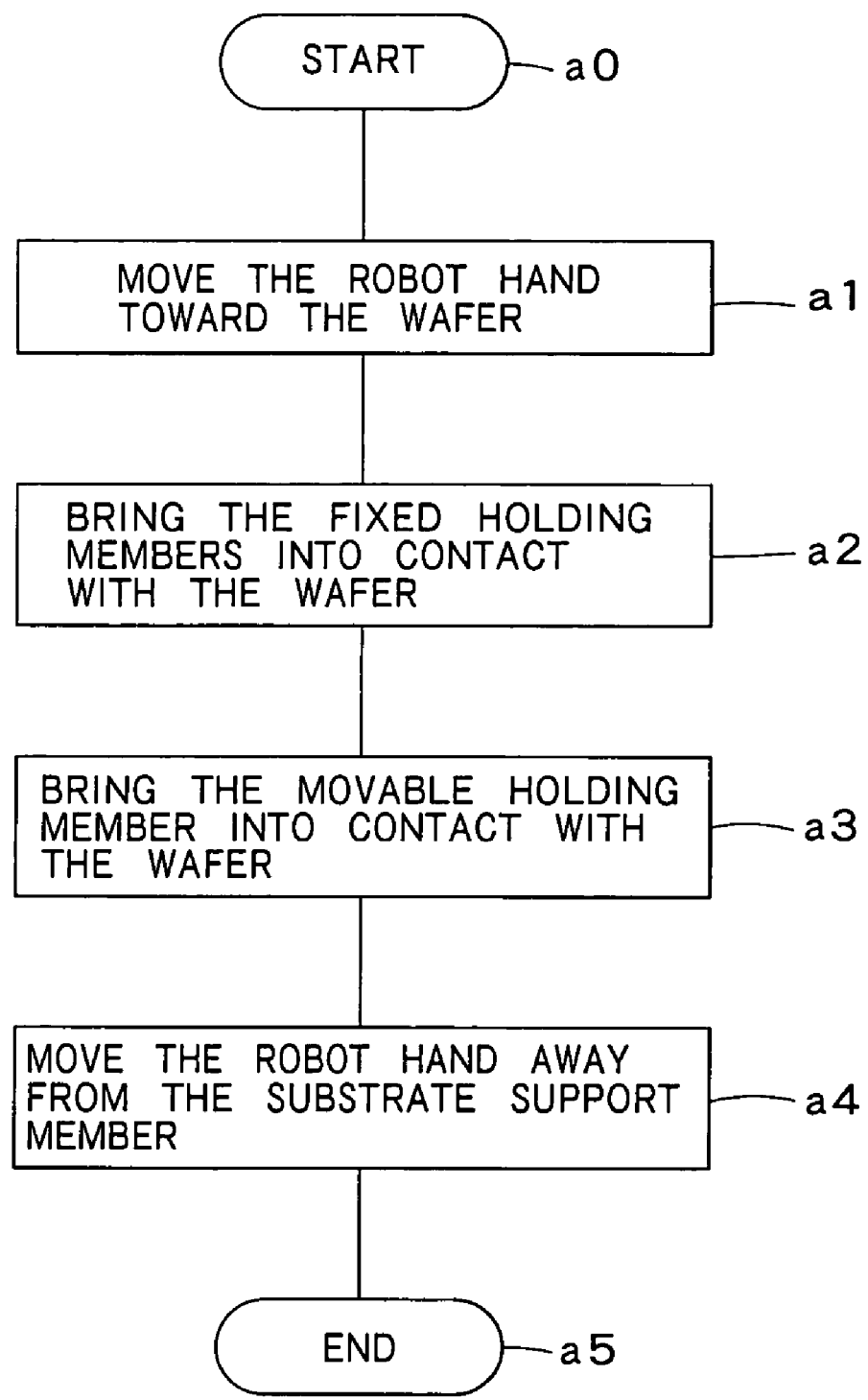
FIG. 23 is a flow chart of a wafer gripping operation to be controlled by a controller.
Figure 24:
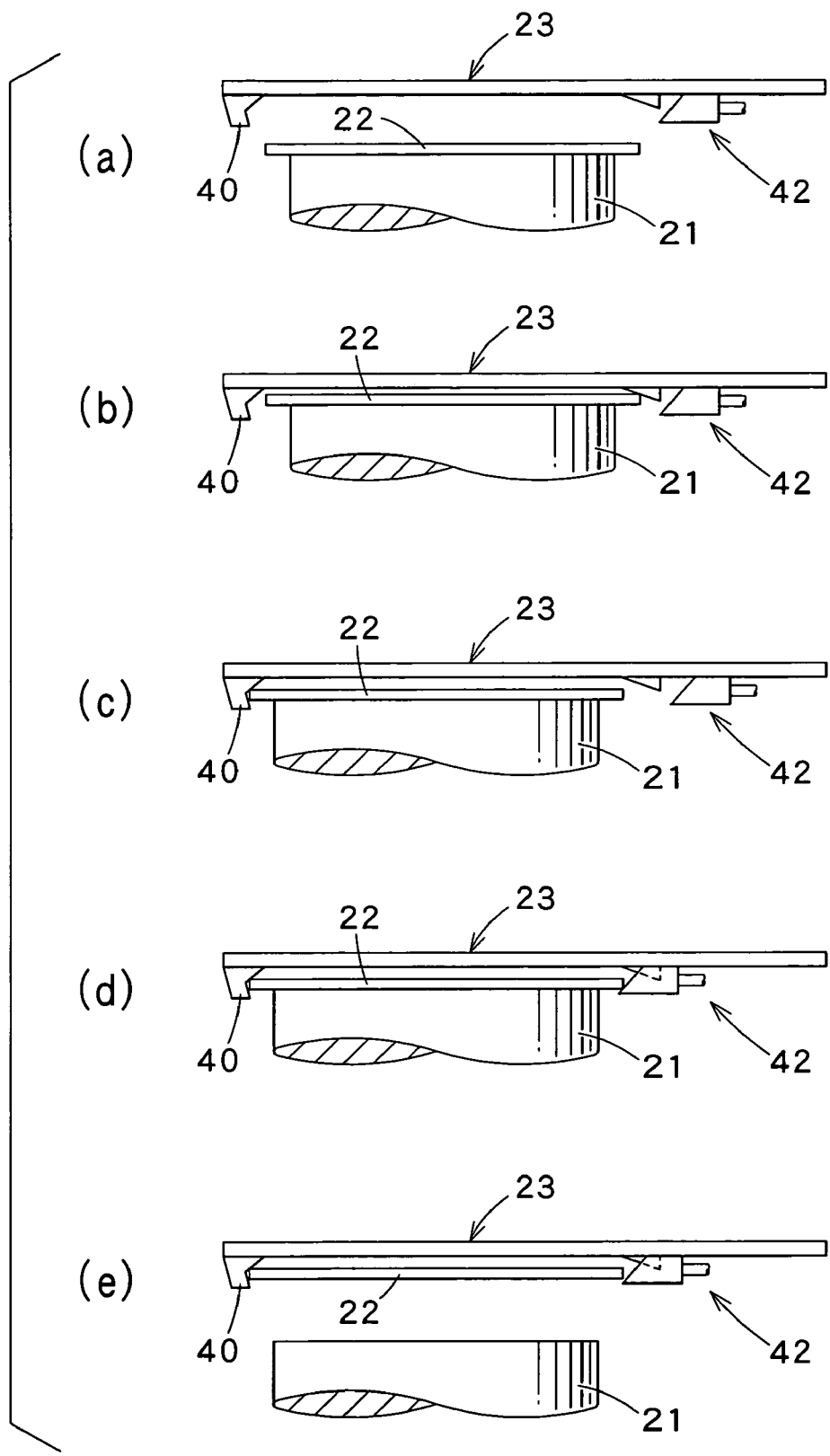
FIGS. 24(a) to 24(e) are typical views of assistance in explaining the wafer gripping operation.

FIG. 23 is a flow chart of a wafer gripping operation to be controlled by the controller 32. FIGS. 24(a) to 24(e) are typical views of assistance in explaining the wafer gripping operation. In step a0, the controller 32 starts a wafer gripping program describing the wafer gripping operation for gripping a wafer 22 supported on the substrate support member 21. In step a1, the controller 32 controls the robot arm 24a to move the robot hand 23 toward the wafer 22 from above the wafer 22 with the movable holder first guide part 60 held at the home position as shown in FIG. 24(a). Step a2 is executed after the holding members 40 to 42 have been disposed near the peripheral parts 19 of the wafer 22 such that the holding members 40 to 42 are radially spaced apart from the circumference of the wafer 22.

In step a2, the controller 32 controls the articulated robot 24 to bring the fixed holding members 40 and 41 into contact with the wafer 22 as shown in FIG. 24(c). Step a3 is executed after the fixed holder first guide surfaces 52 of the fixed holding members 40 and 41 have been brought into contact with the peripheral parts 19 of the wafer 22. In step a2, the controller 32 brings wafer 22 into contact with the movable holder second guide parts 61 of the movable holding member 42.

In step a3, the controller 32 controls the power circuit for driving the air cylinder actuator 34 to bring the movable holder first guide part 60 of the movable holder 42 into contact with the peripheral part 19 of the wafer 22 as shown in FIG. 24(d). Consequently, the wafer 22 is gripped by the peripheral parts 19 by the holding members 40 to 42. Then, step a4 is executed.

In step a4, the controller 32 controls the articulated robot 24 to move the robot hand 23 away from the substrate support member 21 as shown in FIG. 24(e). After the wafer 22 has been gripped by the holding members 40 to 42 at a correct position on the robot hand 23, the wafer gripping operation is ended in step a5.

The wafer 22 can be gripped by the robot hand 23 without causing the wafer 22 to slide on the substrate support member 21 by controlling the articulated robot 24 and the air cylinder actuator 34 by the controller 32. The wafer 22 might slide along the first guide surfaces 52 and 62 when the movable holder first guide part 60 is moved after lifting up the wafer 22 from the substrate support member 21 in a comparative example.

In this embodiment, however, the wafer 22 is separated from the substrate support member 21 after gripping the wafer 22 by the holding members 40 to 42 as shown in FIG. 1. As a result, the sliding of the wafer 22 along the first guide surfaces 52 and 62 can be limited to the shortest possible distance. Thus the possibility of adhesion of particles to the wafer 22 can be reduced and the quality of the wafer 22 can be improved.

Figure 25:
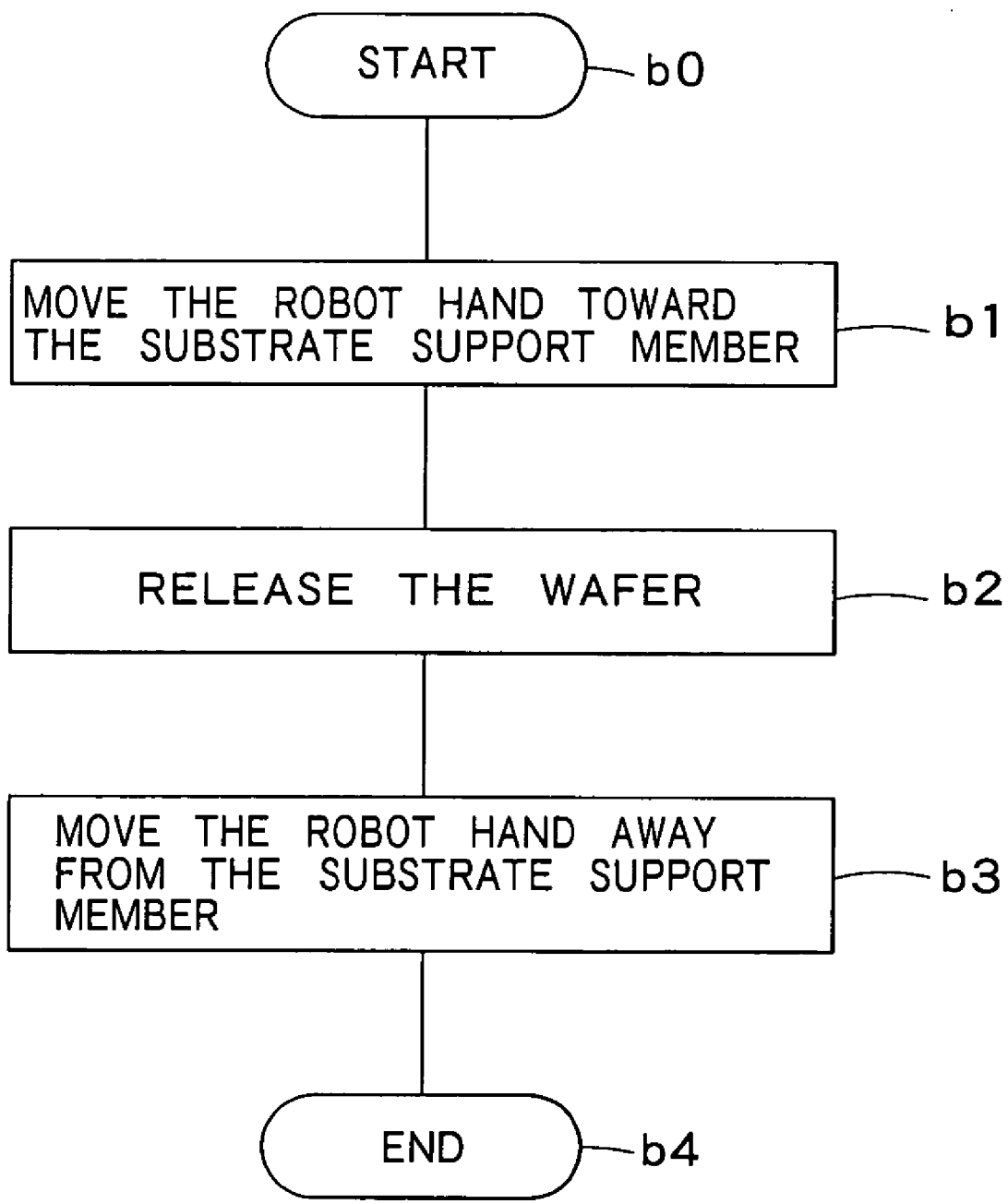
FIG. 25 is a flow chart of a wafer releasing operation to be controlled by the controller.
Figure 26:
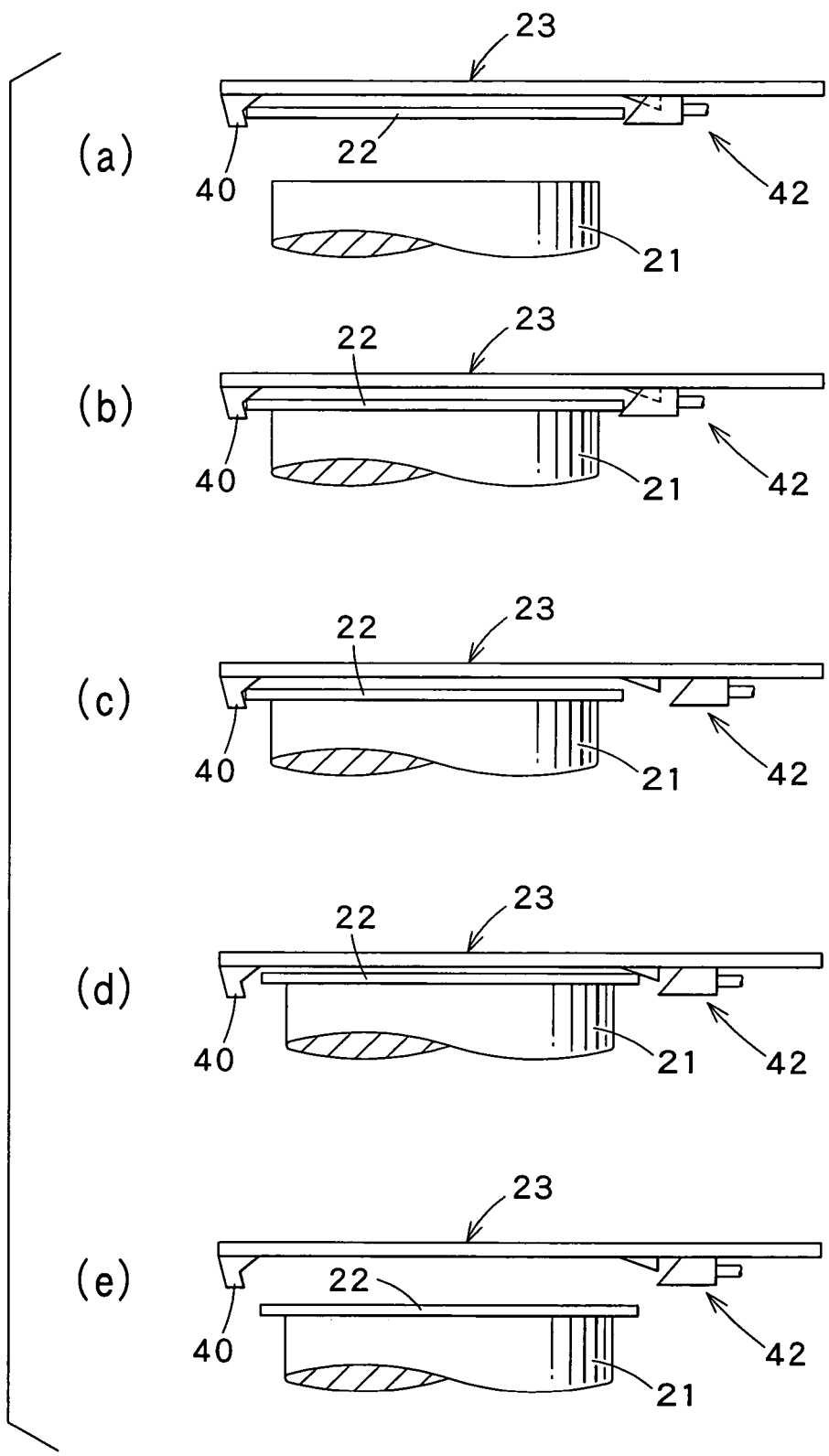
FIGS. 26(a) to 26(e) are typical views of assistance in explaining the wafer releasing operation.

FIG. 25 is a flow chart of a wafer releasing operation to be controlled by the controller 32 and FIGS. 26(a) to 26(e) are typical views of assistance in explaining the wafer releasing operation. In step b0, the controller 32 starts a wafer releasing program describing the wafer releasing operation for placing a gripped wafer 22 on the substrate support member 21. In step b1, the controller 32 controls the articulated robot 24 to move the robot hand 23 holding a wafer 22 toward the substrate support member 21 from above the substrate support member 21 as shown in FIG. 26(a). Then the wafer 22 is disposed close to or in contact with the substrate support member 21, and is placed on the substrate support member 21 as shown in FIG. 26(b). Subsequently, step b2 is executed.

In step b2, the controller 32 controls the power circuit for driving the air cylinder actuator 34 to separate the movable holding member 42 from the peripheral part 19 of the wafer as shown in FIG. 26(c) and controls the driving circuit for driving the articulated robot 24 to separate the fixed holding members 40 and 41 from the peripheral parts 19 of the wafer 19 as shown in FIG. 26(d). The holding members 40 to 42 are thus separated from the wafer 22 substantially simultaneously. Then, step b3 is executed.

In step b3, the controller 32 controls the driving circuit for driving the articulated robot 24 to move the robot hand 23 away from the substrate support member 21 by moving the robot hand 23 upward as shown in FIG. 26(e). Then, the controller 32 ends the wafer releasing operation in step b4.

Since the controller 32 thus controls the articulated robot 24 and the air cylinder actuator 34 to prevent the wafer 22 from sliding on the substrate support member 21, the possibility of adhesion of particles to the wafer 22 can be reduced and the quality of the wafer 22 can be improved. The wafer releasing operation is the same in effect as the wafer gripping operation.

As apparent from the foregoing description, the substrate gripping apparatus embodying the present invention is able to grip the wafer 22 by operating the robot hand 23 in a space on one side of the wafer 22 opposite a space on the other side of the wafer 22 in which the substrate support member 21 is disposed, namely, in a space over the substrate 22. Thus the possibility of interference of the substrate support member 21 with the gripping operation of the robot hand can be reduced. Consequently, restrictions on the shape and construction of the substrate support member 21 and the substrate gripping apparatus 20 can be reduced and troubles in substrate processing can be reduced. Since the interference between the substrate support member 21 and the substrate gripping apparatus 20 can be prevented, a plurality of robot hands can be used to handle a plurality of substrates simultaneously, whereby the efficiency of substrate processing operations can be improved.

Substrates are carried in most cases in a small space, such as a clean room, particularly when substrates to be processed are semiconductor wafers or glass substrates for liquid crystal displays. Since the substrate gripping apparatus 20 in this embodiment has less possibility of interfering with the substrate support member 21. The operator is able to accomplish easily a position teaching operation for teaching positions to the substrate gripping apparatus 20.

The protrusions 55 and 56 can prevent the wafer 22 from slipping off the holding members 40 to 42 in an operation for separating the wafer 22 attracted by suction to the substrate support member 21 from the substrate support member 21, not to speak of an operation for holding the wafer 22 in a horizontal position by the holding members 40 to 42.

Since the first angles θ1 and θ11 and the second angles θ2 and θ12 are determined so as to meet the foregoing conditions, the robot hand 23 is able to grip the wafer 22 in the wide capture ranges even if the robot hand 23 is dislocated relative to the wafer 22. The respective radial dimensions L20 and L21 of the first guide parts 50 and 60 and the respective axial dimensions L8 and L18 of the second guide parts 51 and 61 can be reduced to the least possible extent, so that the robot hand 23 can be formed in a small size and distances for which the robot hand 23 needs to move to grip the wafer 22 are short. Consequently, the substrate gripping apparatus can be formed in small construction even if the articulated robot 24 is provided with a plurality of robot hands.

Figure 27:
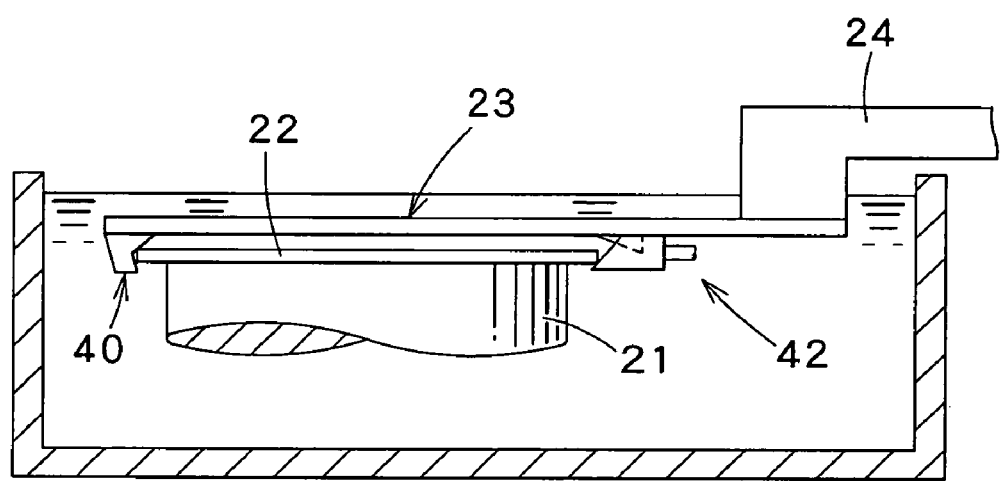
FIG. 27 is a typical view of assistance in explaining another substrate supporting method.

FIG. 27 is a typical view of assistance in explaining another method of supporting a wafer 22 by a submergible substrate gripping apparatus 20 in a preferred embodiment according to the present invention. The submergible substrate gripping apparatus 20 is capable of gripping a wafer 22 supported on a support member 21 in a liquid tank containing a liquid. Resistance exerted on the wafer 22 being lifted up in the liquid is large as compared with that is exerted on the wafer 22 being lifted up in the atmosphere. The submergible substrate gripping apparatus 20, similarly to the forgoing substrate gripping apparatus 20, has holding members 40 to 42 respectively having first guide surfaces 52 and 62 respectively provided with protrusions 55 and 65. The protrusions 55 and 65 restrain the wafer 22 from slipping off the holding members 40 to 42. The submergible substrate gripping apparatus 20 is able to approach the wafer 22 from above the wafer 22. Therefore a hand body 30 does not need to be disposed below the wafer 22, and hence any structures for disposing the hand body 30 below the wafer 22 is not necessary at all and the construction of the submergible substrate gripping apparatus 20 can be simplified.

As mentioned above, the protrusion 55 has an inclined first protruding surface 57. Therefore, the liquid is unable to stay on the first protruding surface 57. Preferably, the position of the protrusion 55 is determined such that the wafer 22 is deformed when a peripheral part 19 of the wafer 22 is in contact with the first guide surface 52. Although the fixed holding member 40 has been described, effects of the other fixed holding member 41 and the movable holding member 42 are the same as those of the fixed holding member 40.

The submergible substrate gripping apparatus embodying the present invention is suitable for separating the wafer 22 from the substrate support member 21 against a large resistance. The resistance against the separation of a substrate from the substrate support member 21 is large when the substrate is held on the substrate support member 21 by suction, when the substrate is lifted up in the liquid or when the substrate is wet and adhering to the substrate support member 21.

The foregoing substrate gripping apparatuss in the preferred embodiments described herein are only examples and various changes may be made therein without departing from the scope of the present invention. The substrate gripping apparatus 20 may be used for gripping an object other than the semiconductor wafer 22, such as a glass substrate for a liquid crystal display. The robot hand 23 may be moved by any suitable driving mechanism other than the articulated robot. The movable holding member driving means for moving the movable holder first guide part 60 may be any suitable linear driving means other than the air cylinder actuator 34, such as a linear driving device including a ball screw and a servomotor.

Although the substrate support member 21 mentioned in the foregoing description supports the wafer 22 thereon, the substrate support member 21 may hold the wafer 22 thereon by suction. When the substrate support member 21 holds the wafer 22 by suction, the wafer 22 can be held by the substrate support member 21 in a vertical position with its axis horizontally extended, and the robot hand is can approach the wafer 22 in a space on one side of the wafer 22 opposite a space on the other side of the wafer 22 in which the substrate support member 21 is disposed. The number of the holding members may be two or above.

The invention claimed is:

1. A substrate gripping apparatus for gripping a substrate from above the substrate, the substrate being supported on a substrate support member below the substrate, said substrate gripping apparatus comprising:

a hand body having a predetermined reference axis and formed in the shape of a flat plate perpendicular to the reference axis;

a hand body driving means for driving the hand body for displacement;

a plurality of holding members including at least one movable one, arranged on a lower side of the hand body around the reference axis at angular intervals and capable of coming into contact with the circumference of the substrate to hold the substrate and of being separated from the circumference of the substrate to release the substrate;

a movable holding member driving means for driving the movable holding member for an approaching movement toward the reference axis and a parting movement away from the reference axis; and a control means for controlling the hand body driving means and the movable holding member driving means;

wherein in a state where the hand body is disposed so as to face an upper surface of the substrate supported on the substrate support member, and the reference axis of the hand body being aligned with a central axis of the substrate, each of the holding members having a first guide part including a first guide surface inclining downwardly toward the reference axis, and a second guide part including a second guide surface facing the upper surface of the substrate and inclining upwardly toward the reference axis, so that the first and second guide surfaces define a substantially V-shaped groove for receiving a peripheral part of the substrate, and the first guide surface having a length that is greater than a distance the movable holding member is capable of moving relative to the reference axis, and the first guide part being provided with a protrusion located at a lower end of the first guide part, the protrusion protruding from the first guide part and protruding from the first guide surface toward the reference axis.

2. The substrate gripping apparatus according to claim 1, wherein the holding members are radially spaced by a distance corresponding to the radius of the substrate apart from the reference axis and are arranged at angular intervals so as to hold the disk-shaped substrate with the axis of the substrate aligned with the reference axis.

3. The substrate gripping apparatus according to claim 1, wherein the first guide part of at least one of the holding members has a first guide surface extending obliquely so as to be gradually apart from the substrate supported on the substrate support member while approaching to the reference axis, and the second guide part of the holding member has a positioning surface continuous with the first guide surface and perpendicular to the reference axis and an inclined surface continuous with the positioning surface and extending obliquely so as to be gradually apart from the substrate while approaching to the reference axis.

4. The substrate gripping apparatus according to claim 1, wherein the first guide part of each of the holding members has a first guide surface extending obliquely so as to be gradually apart from the substrate supported on the substrate support member while approaching to the reference axis, and the second guide part of the same holding member has a positioning surface continuous with the first guide surface and perpendicular to the reference axis, and an inclined surface continuous with the position surface and extending obliquely so as to be gradually apart from the substrate while approaching to the reference axis.

5. The substrate gripping apparatus according to claim 1, wherein the movable holding member driving means applies a resilient force to the movable holding member with a spring to push the movable holding member toward the reference axis.

6. The substrate gripping apparatus according to claim 1 further comprising:

a detecting means for detecting the movable holding member located at a gripping position to grip the substrate together with the rest of the holding members; and an informing means for providing information about the result of a detecting operation performed by the detecting means.

7. The substrate gripping apparatus according to claim 1, wherein the second guide parts of the movable holding member is fixed to the hand body, the first guide part of the movable holding member is driven for displacement by the movable holding member driving means.

8. The substrate gripping apparatus according to the claim 3, wherein the protrusion is formed at the farthest position from the second guide part on the first guide part, and the protrusion comprises a first protruding surface continuous with the first guide surface and sloping down toward the reference axis.

9. The substrate gripping apparatus according to claim 8, wherein the protrusion further comprises a second protruding surface continuous with the first protruding surface and sloping down away from the reference axis.

10. A substrate gripping apparatus for gripping a substrate from above the substrate, the substrate being supported on a substrate support member below the substrate, said substrate gripping apparatus comprising:

a plurality of hand bodies, each having a predetermined reference axis and formed in the shape of a flat plate perpendicular to the reference axis;

hand body driving means for driving the hand bodies for displacement;

a plurality of holding members including at least one movable one, arranged on a lower side of each of the hand bodies around the reference axis at angular intervals and capable of coming into contact with peripheral parts of the substrate to hold the substrate and of being separated from the peripheral parts of the substrate to release the substrate;

a movable holding member driving means for driving the movable holding member of each of the hand bodies for an approaching movement toward the reference axis and a parting movement away from the reference axis; and a control means for controlling the hand body driving means and the movable holding member driving means;

wherein in a state where the hand body is disposed so as to face the upper surface of the substrate supported on the substrate support member, and the reference axis of the hand body being aligned with the central axis of the substrate, each of the holding members having a first guide part including a first guide surface inclining downwardly toward the reference axis, and a second guide part including a second guide surface facing an upper surface of the substrate and including upwardly toward the reference axis, so that the first and second guide surfaces define a substantially V-shaped groove for receiving the peripheral part of the substrate, and the first guide surface having a length that is greater than a distance the movable holding member is capable of moving relative to the reference axis, and the first guide part being provided with a protrusion located at a lower end of the first guide part, the protrusion protruding from the first guide surface toward the reference axis.

11. A substrate gripping method using a substrate gripping apparatus, for gripping a substrate from above the substrate, the substrate being supported on a substrate support member below the substrate, including a hand body having a predetermined reference axis and formed in the shape of a flat plate perpendicular to the reference axis, a hand body driving means for driving the hand body for displacement, a plurality of holding members including at least one movable one, arranged on the lower side of the hand body around the reference axis at angular intervals and capable of coming into contact with peripheral parts of the substrate to hold the substrate and of being separated from the peripheral parts of the substrate to release the substrate, a movable holding member driving means for driving the movable holding member for an approaching movement toward the reference axis and a parting movement away from the reference axis, and a control means for controlling the hand body driving means and the movable holding member driving means, wherein in a state where the hand body is disposed so as to face an upper surface of the substrate supported on the substrate support member, and the reference axis of the hand body being aligned with a central axis of the substrate, each of the holding members having a first guide part including a first guide surface inclining downwardly toward the reference axis, and a second guide part including a second guide surface facing the upper surface of the substrate and inclining upwardly toward the reference axis, so that the first and second guide surfaces define a substantially V-shaped groove for receiving a peripheral part of the substrate, and the first guide surface having a length that is greater than a distance the movable holding member is capable of moving relative to the reference axis, and the first guide part being provided with a protrusion located at a lower end of the first guide part, the protrusion protruding from the first guide part and protruding from the first guide surface toward the reference axis, said substrate gripping method comprising the steps of:

- moving the hand body toward a substrate from one side of the substrate opposite the other side of the substrate on which the substrate support member is disposed;
- bringing a fixed holding member into contact with the peripheral part of the substrate;
- moving the movable holding member toward the reference axis by the movable holding member driving means to bring the movable holding member into contact with the peripheral part of the substrate; and
- moving the hand body away from the substrate support member.

12. A substrate releasing method using a substrate gripping apparatus, for gripping a substrate from above the substrate, the substrate being supported on a substrate support member from below the substrate, including a hand body having a predetermined reference axis and formed in the shape of a flat plate perpendicular to the reference axis, a hand body driving means for driving the hand body for displacement, a plurality of holding members including at least one movable one, arranged on the lower side of the hand body around the reference axis at angular intervals and capable of coming into contact with peripheral parts of the substrate to hold the substrate and of being separated from the peripheral parts of the substrate to release the substrate, a movable holding member driving means for driving the movable holding member for an approaching movement toward the reference axis and a parting movement away from the reference axis, and a control means for controlling the hand body driving means and the movable holding member driving means, wherein in a state where the hand body is disposed so as to face an upper surface of the substrate supported on the substrate support member, and the reference axis of the hand body being aligned with a central axis of the substrate, each of the holding members having a first guide part including a first guide surface inclining downwardly toward the reference axis, and a second guide part including a second guide surface facing the upper surface of the substrate and inclining upwardly toward the reference axis, so that the first and second guide surfaces define a substantially V-shaped groove for receiving a peripheral part of the substrate, and the first guide surface having a length that is greater than a distance the movable holding member is capable of moving relative to the reference axis, and the first guide part being provided with a protrusion located at a lower end of the first guide part protruding from the first guide part, the protrusion protruding from the first guide surface toward the reference axis, said substrate releasing method comprising the steps of:

- moving the hand body gripping a substrate toward the substrate support member and placing the substrate on the substrate support member;
- moving the movable holding member away from the reference axis by the movable holding member driving means to separate the movable holding member from the peripheral part of the substrate; and
- moving the hand body away from the substrate support member.

* * * * *